US008409952B2

(12) United States Patent
Parikh et al.

(10) Patent No.: US 8,409,952 B2
(45) Date of Patent: Apr. 2, 2013

(54) METHOD OF FORMING AN ELECTRONIC DEVICE INCLUDING FORMING A CHARGE STORAGE ELEMENT IN A TRENCH OF A WORKPIECE

(75) Inventors: Suketu Arun Parikh, San Jose, CA (US); Olov B. Karlsson, San Jose, CA (US); Yun Sun, Saratoga, CA (US); Shankar Sinha, Redwood City, CA (US); Timothy Thurgate, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 642 days.

(21) Appl. No.: 12/102,488

(22) Filed: Apr. 14, 2008

(65) Prior Publication Data
US 2009/0256242 A1 Oct. 15, 2009

(51) Int. Cl.
*H01L 21/336* (2006.01)

(52) U.S. Cl. ........ 438/259; 438/288; 438/270; 438/589; 257/E21.693

(58) Field of Classification Search ............ 438/259, 438/266, 288, 589, 268, 270; 257/E21.693
See application file for complete search history.

(56) References Cited

U.S. PATENT DOCUMENTS

| 6,486,028 | B1* | 11/2002 | Chang et al. | 438/259 |
|---|---|---|---|---|
| 6,670,246 | B1* | 12/2003 | Hsiao et al. | 438/276 |
| 7,005,701 | B2* | 2/2006 | Hsiao et al. | 257/328 |
| 2005/0280094 | A1 | 12/2005 | Forbes | |
| 2006/0152978 | A1 | 7/2006 | Forbes | |
| 2006/0166443 | A1 | 7/2006 | Forbes | |
| 2007/0018207 | A1 | 1/2007 | Prinz | |
| 2007/0018216 | A1 | 1/2007 | Chindalore et al. | |
| 2007/0018222 | A1 | 1/2007 | Sadd et al. | |
| 2007/0018229 | A1 | 1/2007 | Yater et al. | |
| 2007/0018232 | A1 | 1/2007 | Chindalore et al. | |
| 2007/0020820 | A1 | 1/2007 | Chindalore et al. | |
| 2007/0020840 | A1 | 1/2007 | Chindalore | |
| 2007/0020845 | A1 | 1/2007 | Swift et al. | |

* cited by examiner

*Primary Examiner* — Jack Chen

(57) ABSTRACT

A method of forming an electronic device including forming a first trench in a workpiece including a substrate, the first trench having side walls and a bottom surface extending for a width between the side walls and forming a charge-storage layer along the side walls and bottom surface of the first trench. The method further includes implanting ions within the substrate underlying the bottom surface of the first trench to form an implant region and annealing the implant region, wherein after annealing, the implant region extends the width of the bottom surface and along a portion of the side walls.

19 Claims, 13 Drawing Sheets

METHOD OF FORMING AN ELECTRONIC DEVICE INCLUDING FORMING A CHARGE STORAGE ELEMENT IN A TRENCH OF A WORKPIECE

CROSS-REFERENCE TO RELATED APPLICATION(S)

Background

1. Field of the Disclosure

The following application is directed to a method of forming an electronic device, and particularly directed to forming charge storage elements within a trench of a workpiece to form an electronic device.

2. Description of the Related Art

Non-volatile memory is used in many types of electronic devices. As the technology continues to progress, the size and power consumption of such storage devices becomes increasingly important. As such, the industry continues to demand storage elements that are more compact and consume less power. Various non-volatile storage cells have been proposed and implemented including, for example, conventional cells that have planar storage elements as well as storage cells employing floating gates. Such planar storage elements are characterized by a channel region within the substrate that is in a substantially planar relationship with respect to the upper surface of the substrate. Typically, such devices consume more power than other devices.

In contrast, floating gate storage elements typically consume less power, however they have their own unique set of problems. For example, because floating gate designs implement a continuous strip of conductive material, such as polysilicon, such designs can be difficult to implement with structures or other designs having a thin dielectric layer that are subject to pin hole defects, which are regions for leakage of current, and destruction of the device by removal of charge.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In an exemplary, non-limiting embodiment, a method of forming an electronic device is disclosed that can include forming a trench in a workpiece and forming a charge storage layer along the side walls and bottom surface of the trench. Moreover, the process further includes implanting ions within the substrate underlying the bottom surface of the trench to form an implant region, and whereupon annealing of the workpiece, the implant region extends along the width of the bottom surface of the trench and along a portion of the side walls of the trench. Formation of such a device facilitates a charge storage structure with a compact design capable of consuming less power. Additionally, the methods disclosed herein further include particular features and a variety of processing methods including formation of implant regions including localized implant regions, particular annealing techniques, and particular etching techniques. Additionally disclosed are particular methods and designs to electrically isolate trenches from one another, and particular designs for forming overlying electrically conductive structures, all of which facilitate the formation of an improved charge storage element.

Figure 1:
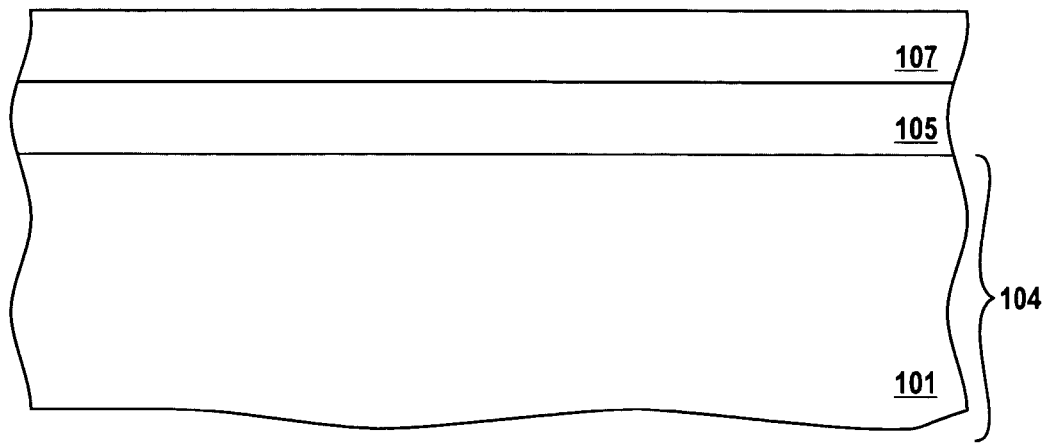
FIG. 1 includes a cross-sectional illustration of a portion of a workpiece including a substrate and a resist layer overlying the substrate in accordance with an embodiment.

Attention is now directed to an embodiment of forming an electronic device through processes illustrated in FIGS. 1-13. FIG. 1 includes a cross-sectional illustration of a portion of the workpiece including a substrate 104. The workpiece further includes a layer 105 overlying the substrate 104 and a resist layer 107 overlying the layer 105. The substrate 104 can include a semiconductor material. For example, the workpiece can include a monocrystalline semiconductor wafer, semiconductor-on-insulator (SOI) wafer, a flat panel display (e.g., a silicon layer over a glass plate), or other substrates conventionally used to form electronic devices. The substrate 104 can include a dopant, such as including a n-type or p-type dopant. Moreover, the substrate 104 can include electronic components or portions of electronic components previously formed thereon. Such electronic components can include for example, implant regions, field isolation regions, or other layers used to form electronic components such as transistors.

The layer 105 overlies the substrate 104 and can include an insulating material. In a particular embodiment, layer 105 can include a nitrogen containing material, and more particularly silicon nitride ($Si_xN_y$). In a more particular embodiment, layer 105 is a hard mask suitable for reducing oxidation of the upper surface of the substrate 104. Layer 105 can be formed by a conventional or proprietary technique.

The resist layer 107 overlies the layer 105 and is suitable for patterning to form features at underlying layers such as at the substrate 104 and layer 105. Generally, the resist layer 107 can include an organic, and more particularly a polymer, such as a resin suitable for use with photolithography. The resist layer 107 can be formed by a conventional or proprietary technique.

Figure 2:
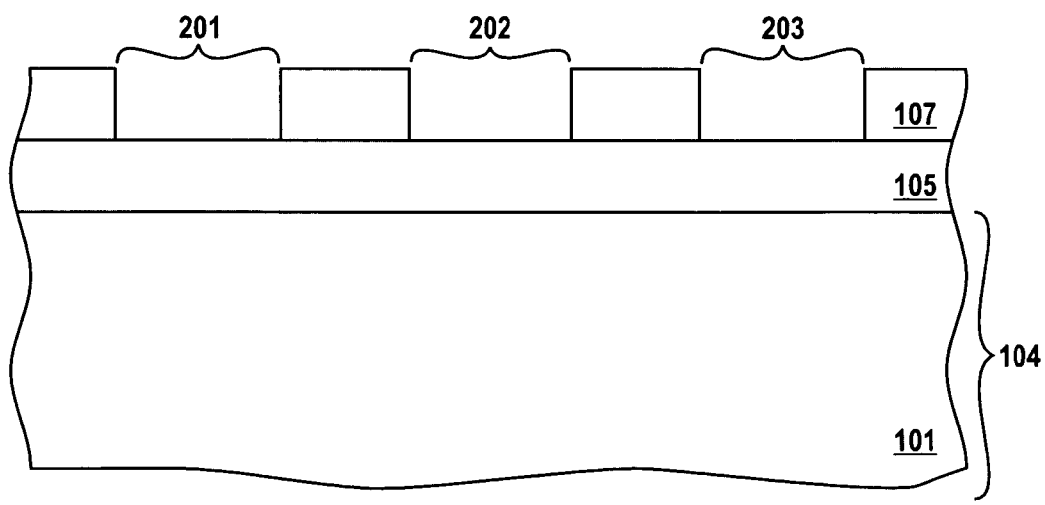
FIG. 2 includes a cross-sectional illustration of the workpiece of FIG. 1 after patterning the resist layer to form openings in accordance with an embodiment.

FIG. 2 includes a cross-sectional illustration of the workpiece of FIG. 1 after forming openings within the resist layer 107. As illustrated, openings 201, 202, and 203 (201-203) are formed within the resist layer 107 to expose the underlying layer 105 and facilitate further processing, such as the formation of trenches at locations underlying the openings 201-203. The openings 201-203 can be formed by a photolithography technique including use of a reticle to expose particular portions of the resist layer 107 to radiation followed by subsequent removal of the exposed portions to form a patterned resist layer having openings 201-203.

Figure 3:
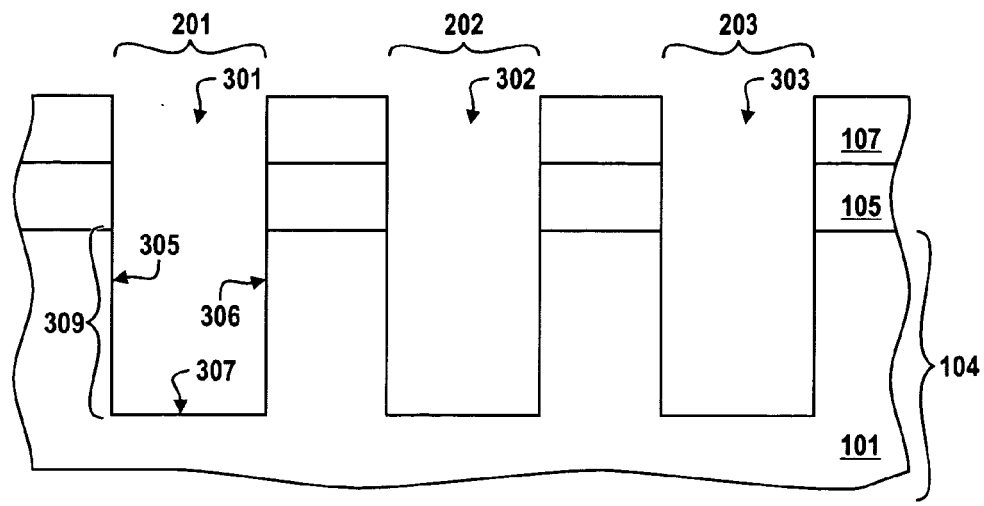
FIG. 3 includes a cross-sectional illustration of the workpiece of FIG. 2 after removing portions of the substrate and layer to form trenches in accordance with an embodiment.

FIG. 3 includes a cross-sectional illustration of the portion of the workpiece of FIG. 2 after forming trenches within the substrate 104 and layer 105 in accordance with an embodiment. As illustrated, portions of the substrate 104 and layer 105 are removed such that trenches 301, 302, and 303 (301-303) are formed within the workpiece of FIG. 3 corresponding to the openings 201-203 previously formed within the resist layer 107. In particular, the trenches have side walls and a bottom surface. For example, trench 301 includes side walls 305 and 306, as well as a bottom surface 307 extending for a width between the side walls 305 and 306.

The formation of the trenches 301-303 can be completed by a selective removal process. In accordance with an embodiment, the formation of trenches 301-303 includes an etching technique, which can include an anisotropic etch or an isotropic etch. Other embodiments may make use of a wet etch technique or a dry etch technique. In accordance with a particular embodiment, formation of trenches 301-303 includes a dry etch technique suitable for selectively removing the material of layer 105, which can include an electrically insulating material, as well as a silicon-containing material of the substrate 104, such as a plasma etching technique.

Generally, the trenches have a depth 309 measured from the top surface of the substrate and extending for a distance into the substrate 104 of at least approximately 50 nm. In another embodiment, the trenches can have a depth 309 that is greater, such as at least approximately 100 nm, or at least approximately 200 nm. In a more particular embodiment, the trenches 301-303 have a depth 309 within a range between approximately 50 nm and approximately 300 nm.

Figure 4:
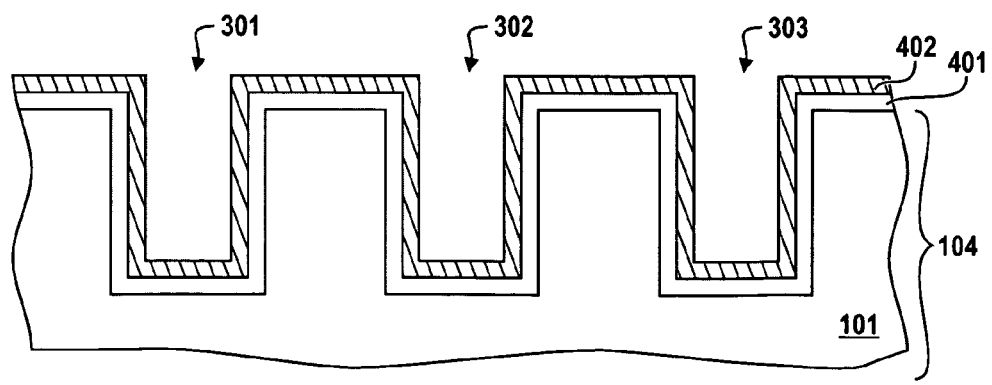
FIG. 4 includes a cross-sectional illustration of the workpiece of FIG. 3 after forming portions of a charge storage layer in accordance with an embodiment.

FIG. 4 includes a cross-sectional illustration of the workpiece of FIG. 3 after forming portions of a charge storage layer within the trenches and overlying the workpiece in accordance with an embodiment. The charge storage layer can include layer 401 and layer 402, which are formed as generally conformal layers overlying portions of the workpiece, and particularly within the trenches along the side walls and bottom surfaces of the trenches 301-303. In accordance with a particular embodiment, the charge storage layer of the final device includes different layers overlying each other, such as a combination of oxygen-containing and nitrogen-containing layers. The formation of the layers 401 and 402 within the trenches 301-303 facilitates formation of a charge storage structure within the trenches 301-303. In particular, layer 401 may be formed by a deposition or growth technique. In accordance with one particular embodiment, layer 401 is deposited via chemical vapor deposition (CVD). In accordance with an embodiment, layer 401 can include an electrically insulating material, such as an oxygen-containing material. In a particular embodiment, layer 401 includes silicon dioxide.

Layer 401 generally is a thin layer, having an average thickness measured along a region parallel to the major plane of the substrate of less than approximately 12 nm. In accordance with an embodiment, layer 401 has an average thickness less than approximately 10 nm, such as less than approximately 8 nm. Still, in another embodiment, the average thickness of layer 401 is at least approximately 0.25 nm, such as at least approximately 0.5 nm, or even at least approximately 1 nm. In accordance with a particular embodiment, layer 401 has an average thickness within a range between approximately 1 nm and approximately 8 nm.

Layer 402 can be a substantially conformal layer overlying layer 401 within the trenches 301-303 as well as between the trenches 301-303. Layer 402 can be formed via a deposition or growth technique. According to an embodiment, layer 402 can be deposited via CVD. In accordance with another embodiment, layer 402 can include a nitrogen-containing material. In a particular embodiment, layer 402 includes silicon nitride ($Si_xN_y$). Generally, layer 402 is formed such that it has substantially the same average thickness as layer 401.

Figure 5:
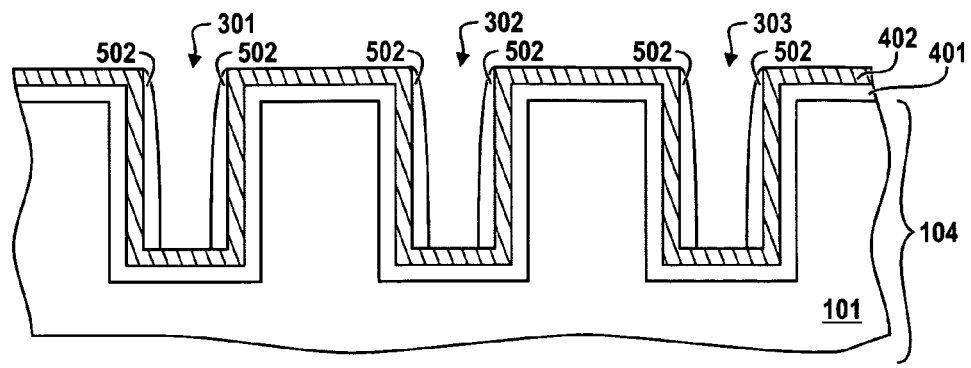
FIG. 5 includes a cross-sectional illustration of the workpiece of FIG. 4 after forming spacers within the trenches in accordance with an embodiment.

FIG. 5 includes a cross-sectional illustration of the workpiece of FIG. 4 after forming spacers within the trenches in accordance with an embodiment. As illustrated, the spacers 502 can be formed along the side wall regions of trenches 301-303 and overlying portions of the layers 401 and 402 along the side wall regions. Formation of the spacers 502 facilitates protection of the side walls from subsequent processing, such as an ion implanting technique and an etching technique. In accordance with an embodiment, spacers 502 can be formed by a conventional or proprietary technique, including for example a deposition followed by an anisotropic etching technique. The spacers 502 can include an electrically insulating material. In a particular embodiment, spacers 502 include a polymer material.

Figure 6:
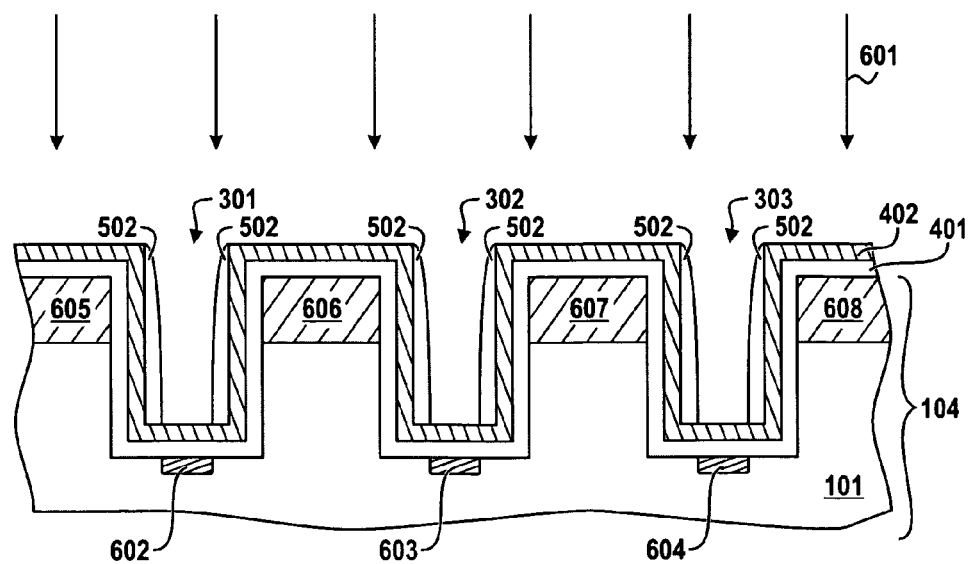
FIG. 6 includes a cross-sectional illustration of the workpiece of FIG. 5 during an ion implantation technique in accordance with an embodiment.

FIG. 6 includes a cross-sectional illustration of the workpiece of FIG. 5 during an ion implanting technique. During the ion implanting technique, ions 601 are directed at the surface of the workpiece to form implant regions 602, 603, and 604 (602-604) underlying the bottom surfaces of the trenches 301-303 and implant regions 605, 606, 607, and 608 (605-608) at locations along the top surface of the substrate 104 adjacent to the tops of the trenches 301-303. In accordance with an embodiment, implant regions 602-604 are formed simultaneously with the formation of implant regions 605-608 as illustrated. Still, in accordance with an alternative embodiment, the implant regions 605-608 may be formed in a separate implant process, such as for example, at the beginning of the process, before forming the trenches 301-303. The ions 601 can include elements or molecules suitable for doping the substrate 104. As such, in accordance with one embodiment, ions 601 can include an n-type dopant or a p-type dopant. In accordance with a particular embodiment, ions 601 include a n-type dopant, and more particularly arsenic (As). Formation of implant regions 602-604 facilitates later formation of bit lines.

Moreover, the implant regions 602-604 can include a dopant that is the same as the dopant incorporated within the layer 103 of the substrate 104. In accordance with a particular embodiment, the implant regions 602-604 and the layer 103 include the same type of dopant material, such as n-type, and more particularly can include the same dopant species, such as arsenic. In accordance with a particular embodiment, the implant regions 602-604 and layer 103 can include substantially the same dopant concentration. As described above, in one particular embodiment, the layer 103 and implant regions 602-604 can include the same type of dopant material and concentration of material as they are formed at the same time.

Figure 7:
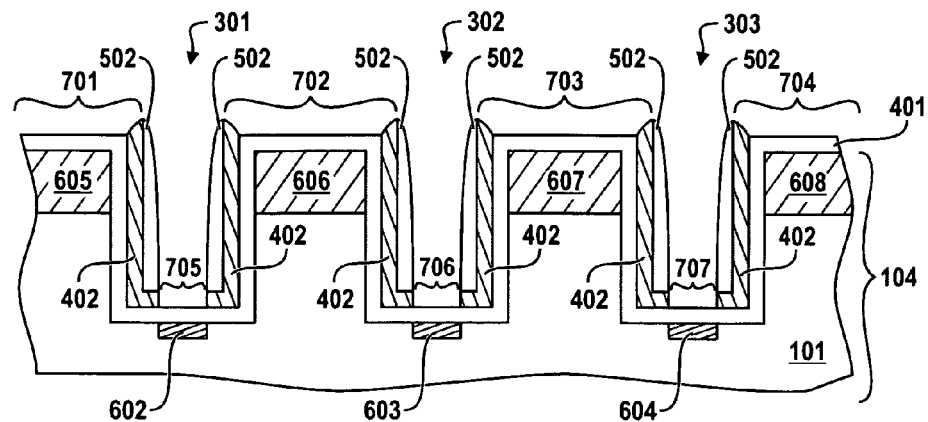
FIG. 7 includes a cross-sectional illustration of the workpiece of FIG. 6 after removing portions of the layers within the trenches and between the trenches in accordance with an embodiment.

FIG. 7 includes a cross-sectional illustration of the workpiece of FIG. 6 after removing portions of layer 402 in accordance with an embodiment. As illustrated in FIG. 7, portions of the layer 402 are removed from portions of the surfaces parallel to the major surface of the substrate 104 at locations 701, 702, 703, 704, 705, 706 and 707 (701-707). Notably, such a process includes removal of portions of the layer 402 at locations 705, 706, and 707 within the trenches 301-303. Portions of the layer 402 remain along the side wall locations, or those portions of the workpiece within the trenches 301-303 that are substantially perpendicular to the major surface of the substrate 104. The removal of portions of layer 402 at locations 701-707 facilitate electrical isolation between the charge storage elements formed within the trenches 301-303.

The portions of layer 402 can be removed from the workpiece using a selective removal process, such as an etching process. According to a particular embodiment, the selective removal process includes a dry etching process, such as a plasma etch. Additionally, according to another embodiment, portions of the layer 401 at locations 701-707 can be also be removed using a selective removal process. As such, in another particular embodiment, removal of layer 401 from portions of the workpiece can include a dry etching process, such as a plasma etch.

Figure 8:
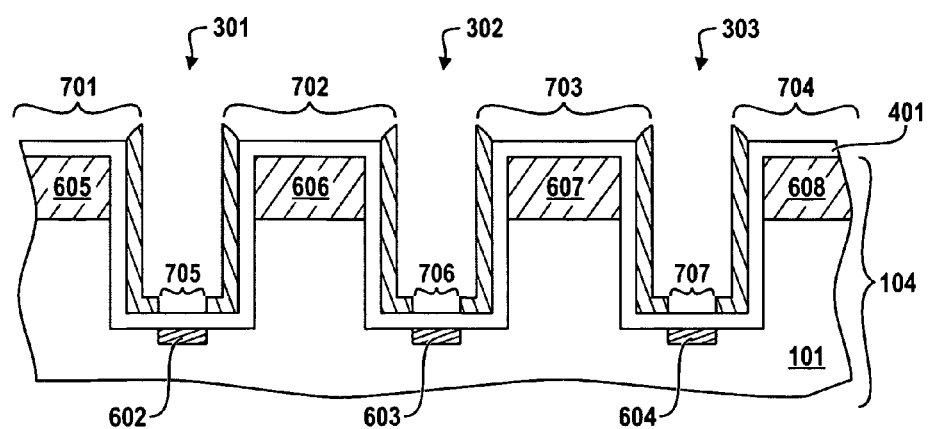
FIG. 8 includes a cross-sectional illustration of the workpiece of FIG. 7 after removing the spacers in accordance with an embodiment.

FIG. 8 includes a cross-sectional illustration of the workpiece of FIG. 7 after removing the spacers 502 of FIG. 7. As illustrated, the spacers previously disposed within the trenches 301-303 have been removed. According to one particular embodiment, removal of the spacers can include a selective etch process, such that the spacers are selectively removed while the other layers of the workpiece are retained. Removal of the spacers from within the trenches 301-303 facilitates further processing of the side walls within the trenches 301-303.

Figure 9:
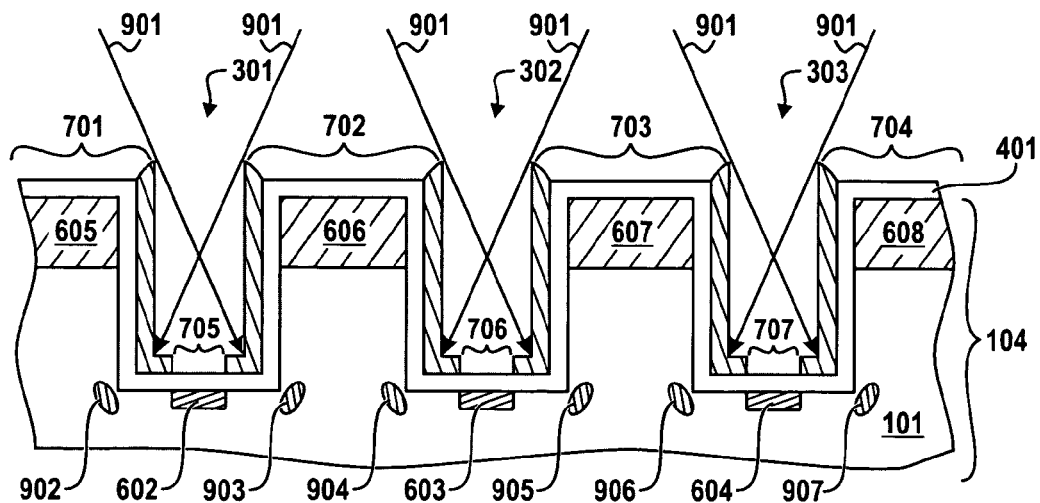
FIG. 9 includes a cross-sectional illustration of the workpiece of FIG. 8 during an ion implanting technique in accordance with an embodiment.

FIG. 9 includes a cross-sectional illustration of the workpiece of FIG. 8 during an ion implantation technique in accordance with an embodiment. During the ion implantation process, ions 901 are implanted into the substrate through portions of the side walls within the trenches 301-303 to form localized implant regions 902, 903, 904, 905, 906, and 907 (902-907) of the dopant type of ions 901. According to an embodiment, the localized implant regions 902-907 are formed on either side of the previously formed implant regions 602-604. As illustrated, the ion implantation process can occur such that the ions 901 are angled with respect to the top surface of the workpiece and form localized implant regions 902-907 primarily located within the bottom corners of the trenches 301-303. For example, the localized implant region 902 is formed such that is localized with respect to the corner of the trench 301 and is adjacent to the implant region 602. Since the ions are angled with respect to the workpiece surface and directed into the trenches at an angle as illustrated in FIG. 9, the ions 901 are not implanted within the previously formed implant regions 602-604.

Moreover the shape of the localized implant regions 902-907 can be different than previously formed implant regions 602-604 given the angle of the ions 901 and the shape of the trenches at the implant regions. For example, the localized implant region 902 (as well as the other localized implant regions) can have an irregular shape, wherein some ions penetrate deeper into the base 101 than other ions. In particular for example, localized implant region 902 includes a portion 910 adjacent to, and in some embodiments abutting, the implant region 602. Moreover, in accordance with another particular embodiment, the ions 901 are given sufficient energy to penetrate to a depth within the substrate 104 such that the implant regions 902-907 do not contact the sidewalls of the trenches 301-303 as illustrated in FIG. 9. As further illustrated in FIG. 9, the implant regions 902-907 can have an irregular shape, such as a Gaussian shape given the natural dispersion of ions from a focal point.

According to one embodiment, the localized implant regions 902-907 can include n-type or p-type dopants. According to another embodiment, the localized implant regions 902-907 include a dopant type that is the opposite of the dopant used to form implant regions 602-604. As such, in a particular embodiment, localized implant regions 902-907 include a p-type dopant, for example, boron. In accordance with another embodiment, the localized implant regions 902-907 can also include a dopant type that is the opposite of the dopant within layer 103.

In further reference to the localized implant regions 902-907, the concentration of dopants within these regions can be less than the concentration of dopants within implant regions 602-604. More particularly, in one embodiment, localized implant regions 902-907 have a dopant concentration that is less than $1 \times 10^{18}$. Still, according to another embodiment, the implant regions 902-907 have a dopant concentration within a range between $11 \times 10^{16}$ to approximately $1 \times 10^{17}$ of a p-type dopant.

Moreover, in accordance with another embodiment, the localized implant regions 902-907 can have a dopant concentration that is less than the dopant concentration of the implant regions 602-604. In a particular embodiment, the dopant concentration of the implant regions 602-604 is at least approximately 5 times greater, such as at least approximately 10 times greater, or even at least approximately 20 times greater. In accordance with another particular embodiment, the dopant concentration of the implant regions 602-604 is within a range between at least approximately 10 times but not more than approximately 1000 times greater than the dopant concentration of the localized implant regions 902-907.

Figure 10:
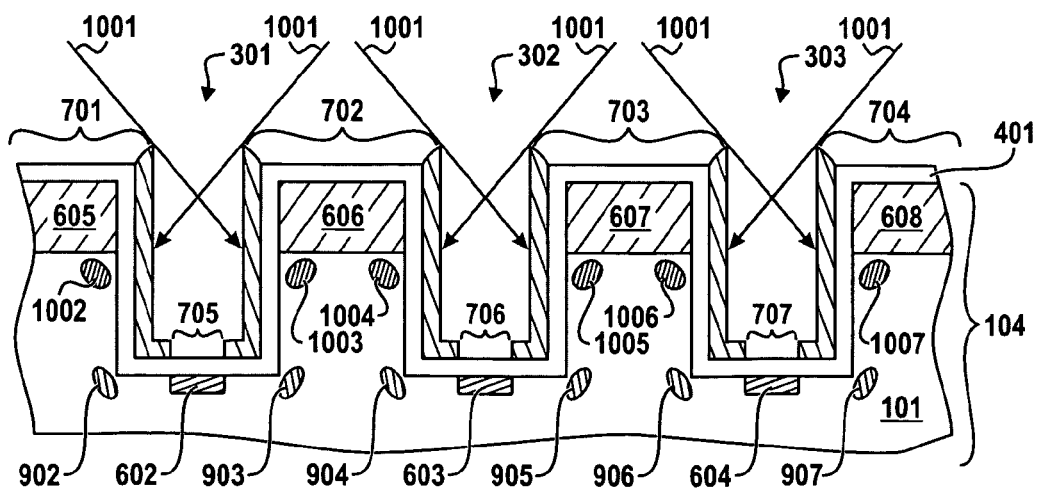
FIG. 10 includes a cross-sectional illustration of the workpiece of FIG. 9 during an ion implanting technique in accordance with an embodiment.

FIG. 10 includes a cross-sectional illustration of the workpiece of FIG. 9 during an ion implantation technique to form additional localized implant regions in accordance with an embodiment. As illustrated in FIG. 10, ions 1001 are directed at the workpiece at angles such that localized implant regions 1002, 1003, 1004, 1005, 1006, and 1007 (1002-1007) are formed within the substrate 104. The formation of the localized implant regions 1002-1007 facilitates control of the final positioning of the implant regions 605-608 relative to the implant regions 602-604 and relative to the trenches 301-303 and more particularly the degree of dispersion of the implant regions 605-608 during an annealing process.

According to one embodiment, the ions 1001 are angled at a different angle relative to the surface of the workpiece, than were ions 901 of FIG. 9. This facilitates forming the localized implant regions 1002-1007 at locations along the side walls of the trenches 301-303 within the substrate 104 underlying layer 103. Like the previously formed localized implant regions 902-907, the localized implant regions 1002-1007 can have an irregular shape, for example a Gaussian shape due to dispersion of the ions from a focal point and differences in the thickness of areas penetrated by the ions 1001. The difference in the depth of penetration of the ions 1001 and the formation of the irregularly shaped localized implant regions 1002-2007 is also due in part to the selected angle that the ions 1001 are directed at the workpiece. In accordance with an embodiment, the type of dopants and the concentration of dopants within the implant regions 1002-1007 can be the same as those localized implant regions 902-907 previously described in accordance with FIG. 9. It should be noted that the ion implantation techniques illustrated in FIGS. 9 and 10 can be completed simultaneously, such that implant regions 902-907 and implant regions 1002-1007 are formed at the same time during a single ion implantation technique using multiple beams of ions directed at different angles to form the implant regions 902-907 and implant regions 1002-1007 as described herein.

Still in accordance with another embodiment, the implantation techniques described in relation to FIGS. 9 and 10 to form implant regions 902-907 and 1002-1007 may not be completed. In certain embodiments, the trenches have a particular depth, such that the ion implantation techniques to form the localized implant regions (i.e., 902-907 and 1002-1007) may not be completed. In such embodiments, the trenches have a sufficient depth and accordingly the sidewalls of the trenches have a sufficient length that the during a subsequent annealing process the implant region at the bottom will not join with an implant region at the top of the trench. For example, the implant region 602 and implant regions 605 and 606 illustrated in FIG. 9 may be formed in and around a trench of sufficient depth wherein the localized implant regions are not formed since during a subsequent annealing process, the depth of the trench is sufficient to stop implant region 602 from dispersing and joining with implant regions 605 or 606. According to an embodiment, trenches have a depth of greater than about 200 nm may not use localized implant regions. In accordance with a more particular embodiment, trenches having a depth between about 120 nm and about 500 nm and more particularly within a range between about 225 nm and about 400 nm.

Figure 11:
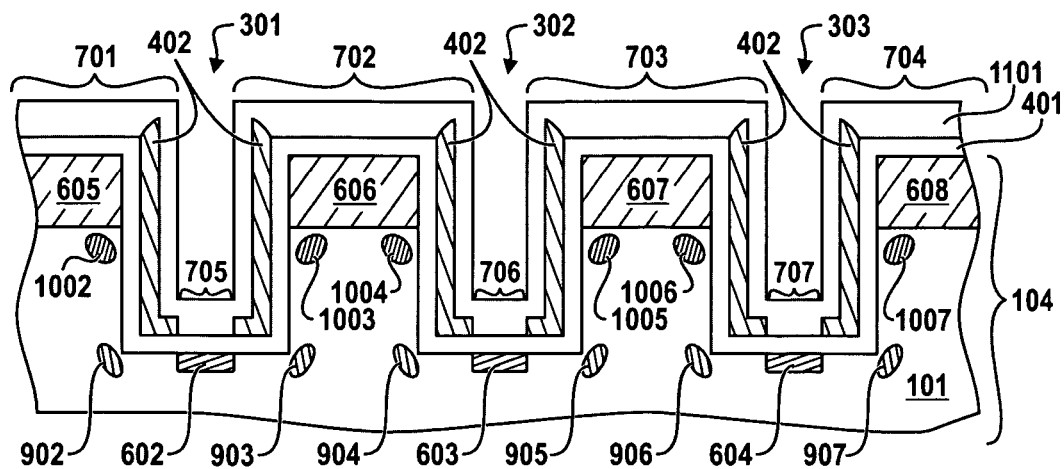
FIG. 11 includes a cross-sectional illustration of the workpiece of FIG. 10 after formation of a layer within the trenches and between the trenches in accordance with an embodiment.

FIG. 11 includes a cross-sectional illustration of the workpiece of FIG. 10 after forming a layer overlying the workpiece in accordance with an embodiment. As illustrated, layer 1101 is formed over the workpiece such that it is generally a conformal layer overlying regions 701-704 between the trenches and the surfaces within the trenches 301-303. According to one embodiment, the layer 1101 is formed such that it overlies the portions of layers 401 and 402 within the trenches 301-303 as well as regions wherein layer 402 and optionally layer 401 may have been removed. According to an embodiment, layer 1101 includes an electrically insulating material. As such, in a particular embodiment, layer 1101 includes an oxide material, and more particularly silicon dioxide.

Layer 1101 can be formed using a growth or deposition process. According to one embodiment, layer 1101 is an oxide-containing layer which is grown on the surface of the workpiece. According to a particular embodiment, formation of the layer 1101 is an oxidation process such that exposed portions of the workpiece, including for example, portions of layer 402 contained along the side walls of the trenches 301-303, are oxidized to form the overlying layer 1101. According to one embodiment, the formation of layer 1101 facilitates the formation of charge storage regions along the side walls of the trenches 301-303 having three layers, and more particularly referred to as an oxygen-nitrogen-oxygen or ONO charge storage structure.

Figure 12:
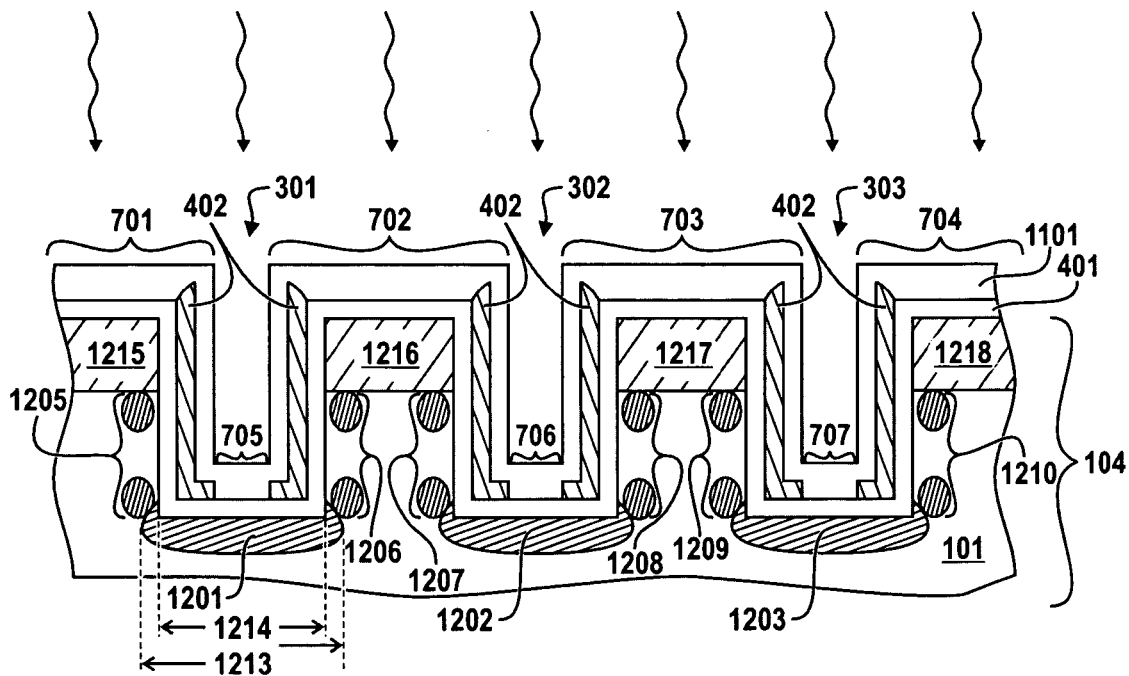
FIG. 12 includes a cross-sectional illustration of the workpiece of FIG. 11 during an annealing process in accordance with an embodiment.

FIG. 12 includes a cross-sectional illustration of the workpiece of FIG. 11 after an annealing process in accordance with an embodiment. Completion of an annealing process facilitates the dispersion of ions previously implanted within the workpiece to form the implant regions 1201, 1202, and 1203 (1201-1203) adjacent to the bottom surfaces of the trenches 301-303 and implant regions 1215, 1216, 1217, and 1218 (1215-1218) adjacent to the upper portions of the trenches 301-303 and the surface of the substrate 104. In accordance with a particular embodiment, the implant regions 1201-1203 have a width that is significantly greater than the average width of the trench. For example, the implant region 1201 has a width 1213 that is significantly greater than the average width 1214 of the trench 301. The formation of implant regions 1201-1203 facilitates the formation of conductive structures underlying the trenches 301-303, such as bit lines.

During the annealing process, implant regions 1205, 1206, 1207, 1208, 1209, and 1210 (1205-1210) are formed by dispersion of the ions within the previously formed localized implant regions. The implant regions 1205-1210 are adjacent to the implant regions 1201-1203 and 1215-1218 and adjacent to but spaced apart from the side wall regions of the trenches 301-303. Accordingly, the formation of the localized implant regions which now form implant regions 1205-1210 facilitates control of the rate of dispersion of the ions within implant regions 1201-1203 and 1215-1218. As described herein, the implant regions 1205-1210 can contain a dopant type that is opposite of that within implant regions 1201-1203 and 1215-1218 and accordingly the rate of dispersion of ions within the implant regions 1201-1203 and 1215-1218 can be reduced as the implant regions 1201-1203 and 1215-1218 come in contact with and abut the implant regions 1205-1210 during the annealing process. In particular, this results in improved control of the dimensions of the implant regions 1201-1203, and more particularly the degree to which they overlap the side wall regions of the trenches 301-303.

Accordingly, control of the dimensions of the implant regions 1201-1203 and the degree of overlap with the side walls of the trenches 301-303 can also facilitate control of the channel length of the final formed charge storage device. Generally, the channel length is the length of the charge storage structure (the three layers 401, 402, and 1101) along the side wall minus the length of sidewall region that is in contact with the implant regions 1201-1203 and 1215-1218. The channel length is described in more detail in accordance with FIG. 23.

Generally, the annealing process can include a rapid thermal anneal (RTA) process. As such, in accordance with an embodiment, the annealing process can include heating the workpiece at a temperature of not less than approximately 600° C. According to another embodiment, annealing includes heating the workpiece at an annealing temperature of not less than approximately 700° C., such as not less than approximately 750° C. According to another embodiment, the annealing process can include heating the workpiece of an annealing temperature of not greater than approximately 1100° C., such as not greater than approximately 1000° C., or even not greater than approximately 900° C. In accordance with one particular embodiment, the annealing process can include heating the workpiece at an annealing temperature within a range between approximately 750° C. and approximately 900° C.

Moreover, during a RTA process, the workpiece can be heated at the annealing temperature for at least approximately 30 seconds. In accordance with another embodiment, the workpiece can be heated at the annealing temperature for at least approximately 45 seconds, such as at least approximately 50 seconds. Still in accordance with a particular embodiment, the workpiece is heated at the annealing temperature for a time period within a range between about 50 seconds and about 180 seconds.

In accordance with another embodiment, the atmosphere used during the annealing process can include a noble gas or an inert gas. In accordance with an embodiment, the atmosphere includes primarily nitrogen. Moreover, the atmosphere during the annealing process is typically at atmospheric pressure.

Figure 13:
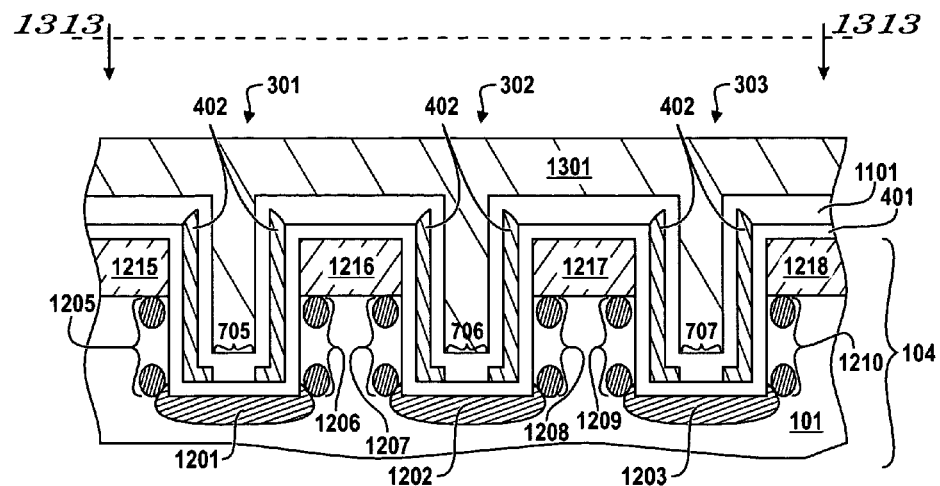
FIG. 13 includes a cross-sectional illustration of the workpiece of FIG. 12 after formation of an electrically conductive structure overlying the trenches and within the trenches in accordance with an embodiment.

FIG. 13 includes a cross-sectional illustration of the workpiece of FIG. 12 after forming an electrically conductive structure over portions of the workpiece in accordance with an embodiment. As illustrated, an electrically conductive structure 1301 is formed overlying the trenches 301-303 and within the trenches 301-303. Generally, the formation of the electrically conductive structure 1301 facilitates control of charge flow through the charge storage regions disposed along the side walls of the trenches 301-303. In accordance with a particular embodiment, the electrically conductive structure 1301 is a word line. As such, in accordance with an embodiment, the electrically conductive structure 1301 can include an electrically conductive material. In accordance with a particular embodiment, the electrically conductive structure 1301 can include polysilicon. In accordance with a more particular embodiment, the electrically conductive structure 1301 can include polysilicon such that a SONOS (Silicon/Oxide/Nitride/Oxide/Silicon) electronic component is formed. In an alternative embodiment, the electrically conductive structure 1301 can include a metal, such as tantalum (Ta) such that a TANOS (Tantalum/Alumina/Nitride/Oxide/Silicon) electronic component is formed.

Figure 24:
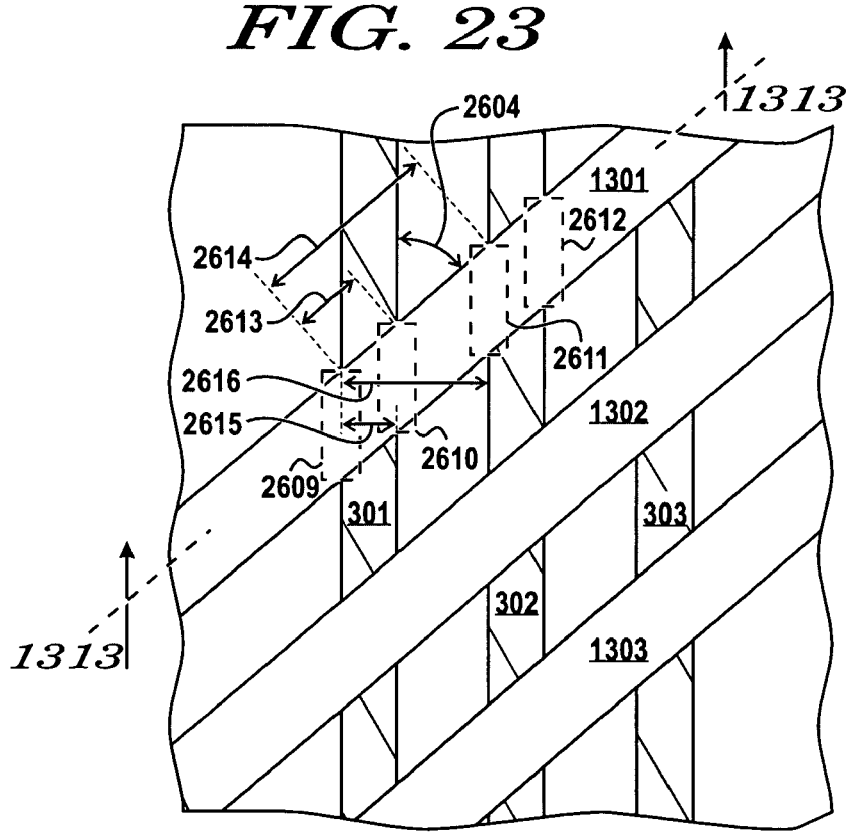
FIG. 24 includes a top view of a workpiece including trenches having overlying electrically conductive structures at a non-orthogonal angle in accordance with an embodiment.

Referring briefly to FIG. 24, a top view of the workpiece of FIG. 13 is illustrated including the trenches and overlying word lines in accordance with an embodiment. As illustrated, the electrically conductive structures 1301, 1302, and 1303 (1301-1303) overlie portions of the trenches 301-303 and facilitate the formation of word lines. In one embodiment, the electrically conductive structures 1301-1303 are angled with respect to the length of the trenches 301-303. For example, the electrically conductive structure 1301 forms an angle 2604 with the trench 301 that is non-orthogonal, and more particularly an acute angle. As such, in accordance with a particular embodiment, the angle 2604 between the electrically conductive structure 1301 and the trench 301 is an acute angle within a range between approximately 30 degrees and approximately 60 degrees. In another more particular embodiment, the angle 2604 can be approximately 45 degrees. Moreover, as the electrically conductive structures 1301-1303 are formed such that they extend in a direction substantially parallel to each other, each of the electrically conductive structures 1301-1303 form substantially the same angle with each of the trenches 301-303.

Formation of the electrically conductive structures 1301-1303 at a non-orthogonal angle 2604 with respect to the lengths of the trenches 301-303 facilitates greater spacing between charge storage structures than can be accomplished had the charge storage structures 1301-1303 been formed at an orthogonal angle relative to a length of the trenches 301-303. As illustrated, the trenches include charge storage structures 2609, 2610, 2611, and 2612 disposed along the side walls of the trenches. For example, charge storage structures 2609 and 2610 are adjacent structures within the trench 301, and the centers of these structures represented by the side walls of the trench 301 are separated by a distance 2615, which would otherwise be the spacing between the charge storage structures if an electrically conductive structure were formed at an orthogonal angle to the length of the trench 301. As illustrated, the formation of the electrically conductive structure 1301 at a non-orthogonal angle relative to the length of the trench 301, increases the distance 2613 between the charge storage structures 2609 and 2610 as compared to the width 2615 of the channel 301. Accordingly, greater spacing, and thus improved electrical insulation between adjacent charge storage structures 2609 and 2610 within the same trench 301 is facilitated. Moreover, greater distance, and thus greater electrical insulation is achieved between charge storage structures contained within different channels, such as charge storage structures 2609 and 2611 contained within trenches 301 and 302 respectively, which are separated by a distance 2614 that is greater than distance 2616. Such a design can facilitate improved performance and reliability of charge storage structures.

Figure 14:
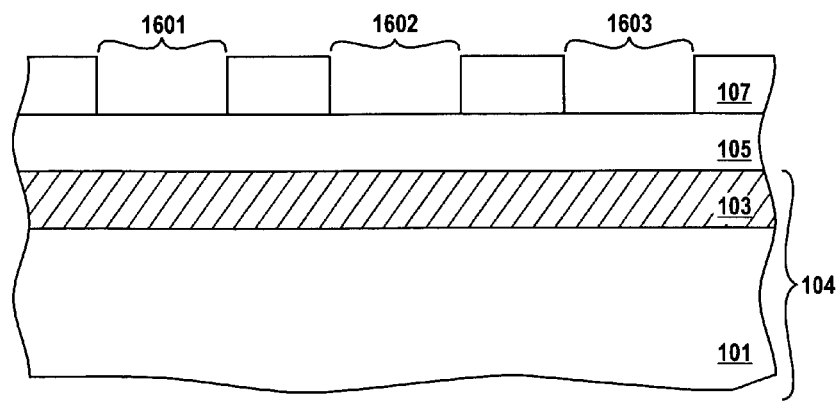
FIG. 14 includes a cross-sectional illustration of a workpiece including a substrate and a patterned resist layer overlying the substrate and having openings in accordance with an embodiment.

Attention is now directed to particular embodiments of forming an electronic device through processes illustrated in FIGS. 14-21. In particular, FIGS. 14-21 provide another method to forming electronic devices, and particularly electronic devices having a suitable electrical isolation via source trench isolation unit. FIG. 14 includes a cross-sectional illustration of a portion of a workpiece including a substrate 104 having a base 101 and a doped layer 103, a layer 105 overlying the substrate 104, and a resist layer 107 overlying the layer. In accordance with an embodiment, the resist layer 107 includes openings 1601, 1602, and 1603. The openings can be formed using methods described herein in accordance with FIG. 2. Moreover, the properties and characteristics of the workpiece and layers of the workpiece are the same as those described herein in accordance with FIG. 2. In particular, the doped layer 103 can be formed prior to the formation of the layer 105 and the resist layer 107. Doped layer 103 can be formed prior to the formation of the layer 105 and resist layer 107. More particularly, doped layer 103 can later be used to form implant regions adjacent to the tops of the trenches previously illustrated as implant regions 1215-1218 in FIG. 13.

Figure 15:
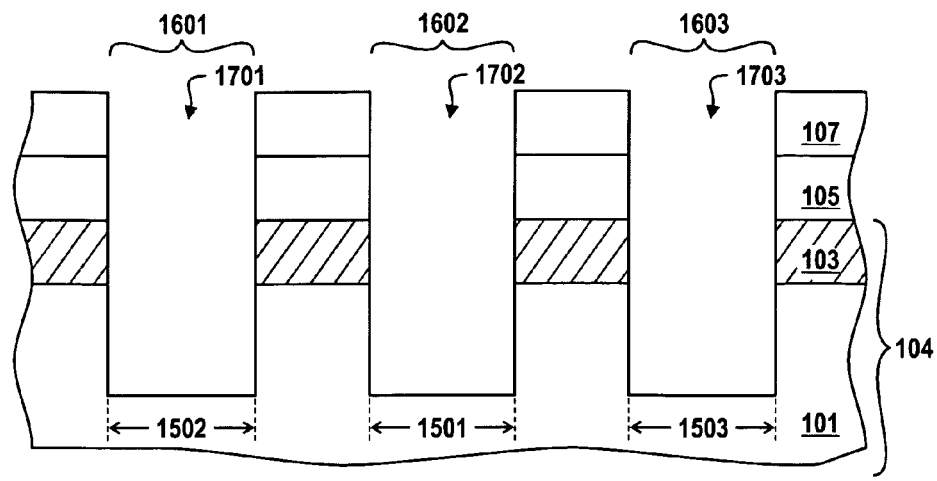
FIG. 15 includes a cross-sectional illustration of the workpiece of FIG. 14 after formation of trenches within the workpiece in accordance with an embodiment.

FIG. 15 includes a cross-sectional illustration of the workpiece of FIG. 14 after forming trenches within the workpiece in accordance with an embodiment. Accordingly, the trenches 1701, 1702, and 1703 (1701-1703) can be formed in the same manner as previously described in accordance with FIG. 3. Notably, the openings 1601 and 1603 within the resist layer 107 have a different width than the opening 1602 and accordingly, the width of the trenches 1701 and 1703 is different than the width of trench 1702. According to one embodiment, trench 1702 has a width 1501 that is less than the widths 1502 and 1503 of trenches 1701 and 1703 respectively. In accordance with another embodiment, the trench 1702 has a width that is at least approximately 50% and not greater than approximately 95% of the width 1502 of the trench 1701 (or width 1503 of trench 1703).

In a more particular embodiment, the width 1501 of trench 1702 is generally not greater than approximately 70 nm. In accordance with another embodiment, the width 1501 of trench 1702 can be less, such as not greater than approximately 60 nm or not greater than approximately 55 nm. Still, in another embodiment, the width 1501 of trench 1702 is at least approximately 40 nm, such as at least approximately 45 nm. According to a more particular embodiment, the trench 1702 can have a width 1501 within a range between approximately 45 nanometers and approximately 55 nanometers.

As described herein, the trenches 1701 and 1703 can have widths 1502 and 1503 respectively that are greater than the width 1501 of trench 1702. Accordingly, in a particular embodiment, the widths 1502 and 1503 can be at least approximately 40 nm, such as at least approximately 50 nm, or even at least approximately 55 nm. Still, the widths 1502 and 1503 are generally limited, such that they are not greater than approximately 80 nm, such as not greater than approximately 70 nm, or not greater than approximately 65 nm. As such, in a more particular embodiment, the trenches 1701 and 1703 have widths 1502 and 1503 respectively that are within a range between approximately 55 nm and approximately 65 nm.

Figure 16:
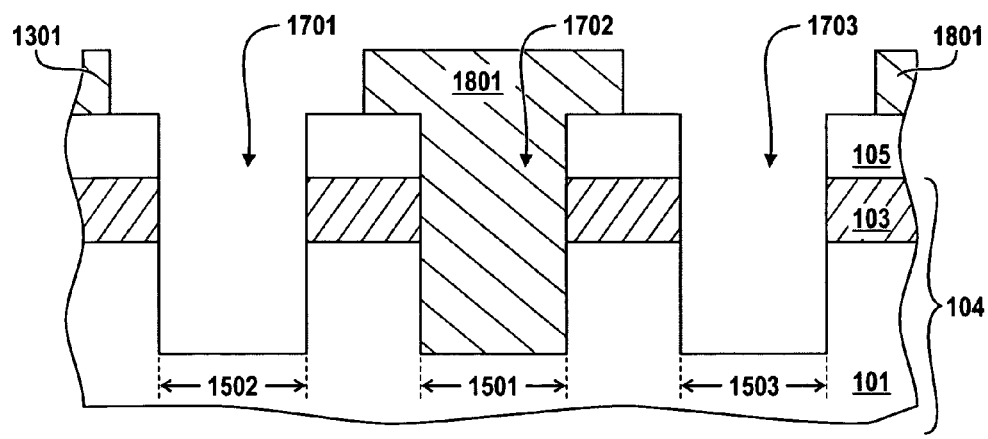
FIG. 16 includes a cross-sectional illustration of the workpiece of FIG. 15 after removal of the resist layer and patterning emplacement of a new resist layer in accordance with an embodiment.

FIG. 16 includes a cross-sectional illustration of the workpiece of FIG. 15 after forming and patterning a resist layer over portions of the workpiece in accordance with an embodiment. As illustrated, a resist layer 1801 can be formed over portions of the workpiece, and in particular, the resist layer 1801 is formed to overlie and be disposed within the trench 1702. In accordance with a particular embodiment, the resist layer 1801 can be patterned, such as by a photolithography technique, such that there is no resist layer 1801 overlying or within the trenches 1701 and 1703. The selective formation of the resist layer 1801 within particular trenches, such as trench 1702 facilitates further processing of trenches 1701 and 1703 without affecting trench 1702. Moreover, the resist layer 1801 can be formed and patterned according to a conventional or proprietary technique.

Figure 17:
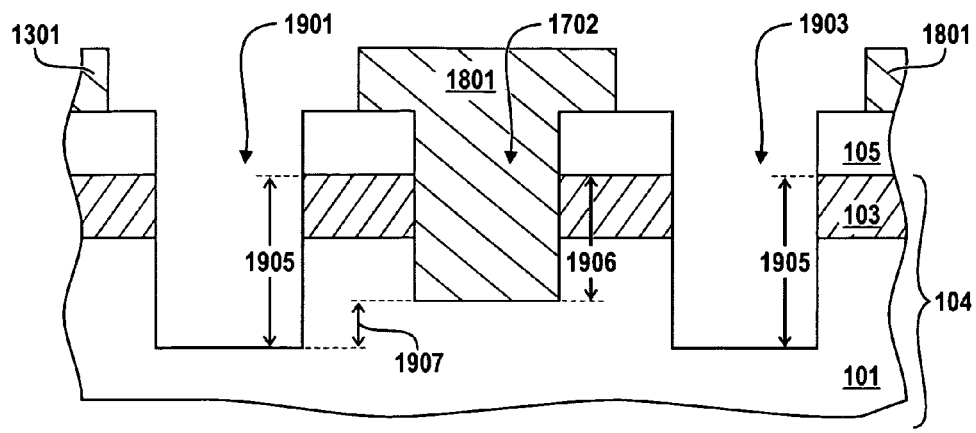
FIG. 17 includes a cross-sectional illustration of the workpiece of FIG. 16 after selectively removing material from particular trenches in accordance with an embodiment.

FIG. 17 includes a cross-sectional illustration of the workpiece of FIG. 16 after selectively removing material from particular trenches in accordance with an embodiment. As illustrated, a selective removal process has been completed such that trenches 1901 and 1903 have a depth that is greater than trench 1702. The selective removal of material from trenches 1901 and 1903 can be completed via an etching process. In accordance with a particular embodiment, selective removal of material from the trenches 1901 and 1903 can include a dry etch process, more particularly a plasma etching process.

Moreover, after the selective removal process, trenches 1901 and 1903 have a depth 1905 as measured from the top surface of the substrate 104 that is significantly greater than a depth 1906 of the trench 1702. According to a particular embodiment, the difference in the depths 1907 between the trenches 1901 and 1903 and the trench 1702 is at least approximately 5% of the depth 1905 of the trench 1901. In accordance with another embodiment, the difference in depths 1907 can be greater, such that the difference 1907 is at least approximately 10%, such as least approximately 15%, or even at least approximately 20% of the depth 1905 of the trench 1901. In accordance with another embodiment, the difference 1907 in depths between trenches 1901 and 1903 and the trench 1702 is not greater than approximately 60% of the depth 1905. Still, the difference 1907 can be less, such as not greater than approximately 50%, such as not great than approximately 40%, or even not greater than approximately 35% of the depth 1905 of the trench 1901. According to a particular embodiment, the difference 1907 in depth between the trench 1901 and trench 1702 is within a range between approximately 20% and approximately 35% of the depth 1905 of trench 1901.

In particular reference to dimensions of the trenches 1901 and 1903, generally, the depth 1905 of trenches 1901 and 1903 is at least approximately 80 nm. Still, the depth 1905 can be greater, such that trenches 1901 and 1903 have a depth 1905 of at least approximately 90 nm, or even at least approximately 100 nm. According to a particular embodiment, trenches 1901 and 1903 can have a depth 1905 that is within a range between approximately 100 nm to approximately 250 nm, and more particularly within a range between approximately 100 nm and approximately 200 nm. Generally, control of the depth 1905 of channels 1901 and 1903 facilitates control of the channel length of the devices to be formed within these trenches. Accordingly, short channel devices can be formed such that the depth of the channels 1901 and 1903 is generally approximately 100 nm. Alternatively, long channel devices can be formed wherein the channels 1901 and 1903 have a greater depth 1905 such as on the order of approximately 200 nm.

Figure 18:
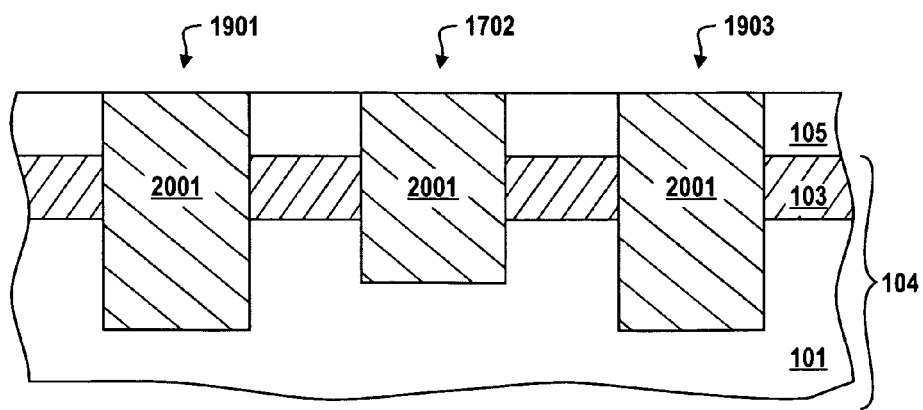
FIG. 18 includes a cross-sectional illustration of the workpiece of FIG. 17 after removal of the resist material and filling the trenches with an electrically insulating material in accordance with an embodiment.

FIG. 18 includes a cross-sectional illustration of the workpiece of FIG. 17 after removing portions of the resist layer and filling the trenches in accordance with an embodiment. As illustrated, after selectively etching portions of the workpiece to create trenches 1901 and 1903, the remaining resist layer overlying the workpiece can be removed according to a conventional or proprietary technique. Moreover, after removing remaining portions of the resist layer, a material 2001 can be deposited over the workpiece such that the material 2001 overlies and is disposed within the trenches 1901, 1702, and 1903. Formation of the layer 2001 can be completed by a deposition or growth process. According to a particular embodiment, depth layer 2001 is formed via a deposition technique. More particularly, material 2001 can include an electrically insulating material. Suitable electrically insulating materials can include oxide-containing materials, and more particularly silicon dioxide.

As further illustrated in FIG. 18, after forming layer 2001 a planarization technique can be completed such that the material 2001 not disposed within the trenches is removed from the top surface of the workpiece. Such a selective removal process can be completed via a chemical mechanical planarization (CMP) process that selectively removes the material 2001 from the upper surface of the workpiece. Such a selective material removal process is further facilitated by the presence of layer 105, which as described previously, can include a hard mask.

Figure 19:
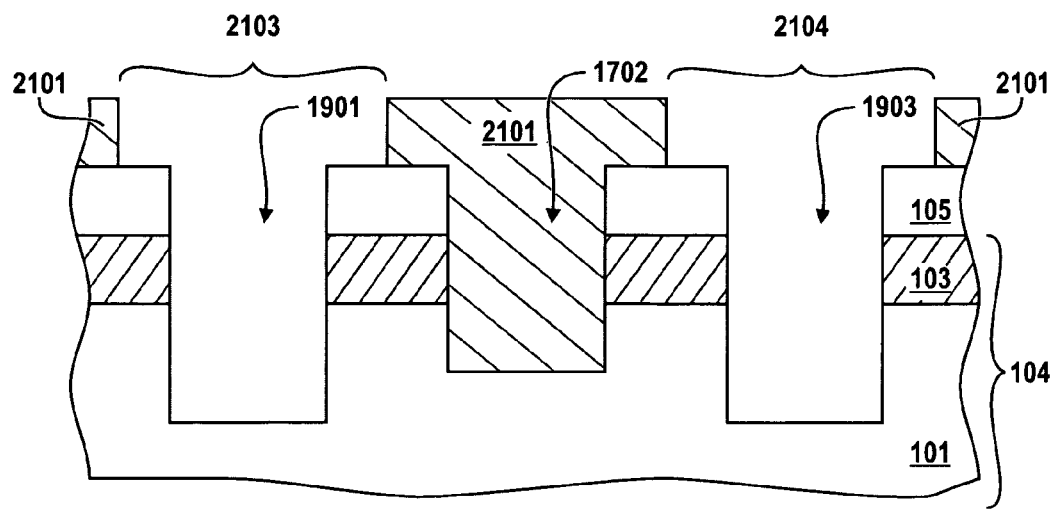
FIG. 19 includes a cross-sectional illustration of the workpiece of FIG. 18 after formation of a resist layer overlying one of the trenches in accordance with an embodiment.

FIG. 19 includes a cross-sectional illustration of the workpiece of FIG. 18 after patterning a resist layer to overly portions of the workpiece and selectively removing material from particular trenches within the workpiece in accordance with an embodiment. After forming material 2001 within the trenches 1901, 1702, and 1903, a resist layer 2101 can be formed over the workpiece and patterned such that openings 2103 and 2104 within the resist layer 2101 are formed corresponding to trenches 1901 and 1903. The openings 2103 and 2104 can be formed according to conventional or proprietary techniques for patterning and removing material from a resist layer 2101.

After forming the openings 2103 and 2104, the material 2001 previously disposed within trenches 1901 and 1903 can be selectively removed. In accordance with an embodiment, selective removal process can include an etching process, such as a dry etching process, and more particularly a plasma etching process. Accordingly, the electrically insulating material 2001 is removed from trenches 1901 and 1903 while it remains within trench 1702.

Figure 20:
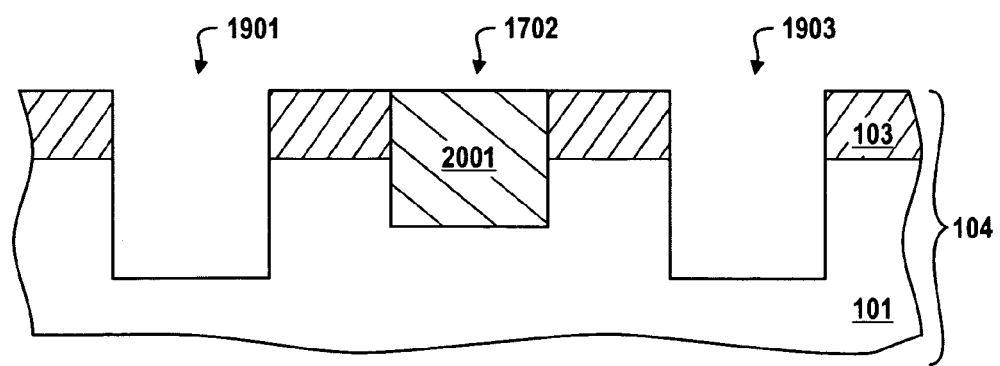
FIG. 20 includes a cross-sectional illustration of the workpiece of FIG. 19 after removing the resist layer and a layer overlying the substrate in accordance with an embodiment.

FIG. 20 includes a cross-sectional illustration of the workpiece of FIG. 19 after selectively removing portions of the resist layer and the overlying layer from the workpiece in accordance with an embodiment. As illustrated, after selectively removing the electrically insulating material 2001 from the trenches 1901 and 1903, the remaining portions of the resist layer can be removed from the workpiece, which can include a conventional or proprietary technique. Moreover, layer 105, which can include a hard mask material, is further removed from the workpiece. According to an embodiment, removal of layer 105 can include a CMP technique. Removal of the layer 105 overlying the substrate 104 facilitates preparation of the workpiece for further processing including the formation of the charge storage structures within trenches 1901 and 1903.

Figure 21:
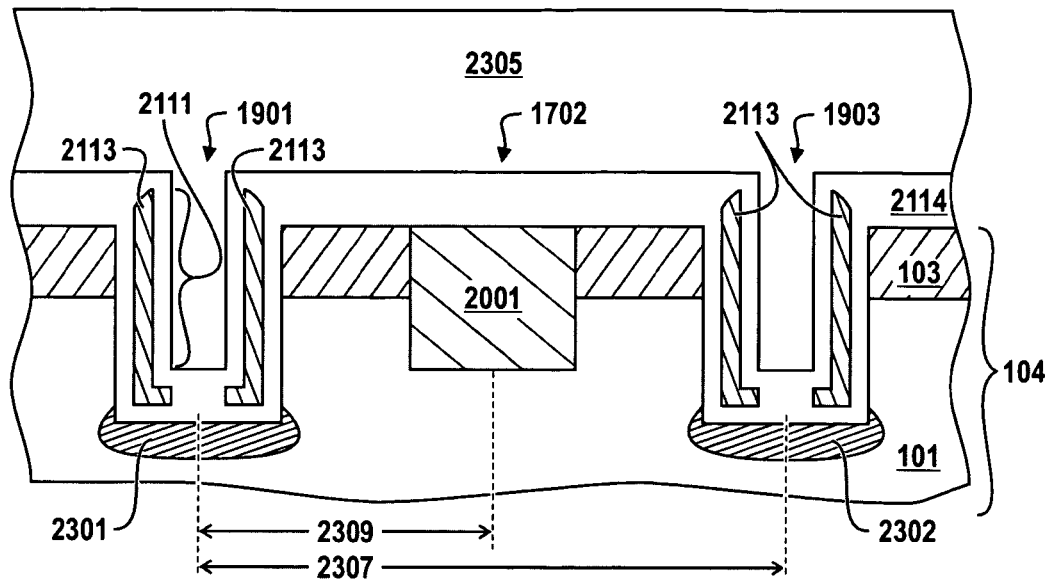
FIG. 21 includes a cross-sectional illustration of the workpiece of FIG. 20 after formation of a charge storage layer within the trenches and an electrically conductive structure within the trenches and overlying the trenches in accordance with an embodiment.

FIG. 21 includes a cross-sectional illustration of the workpiece of FIG. 20 after forming charge storage structures and an overlying electrically conductive structure in accordance with an embodiment. As illustrated, after removing the hard mask layer overlying the substrate 104, charge storage structures can be formed within trenches 1901 and 1903 in accordance with processes described in embodiments herein. Notably, such processes can include those processes described in FIGS. 4 through 13. As such, for example a charge storage structure 2111 can be formed along the side wall region of trench 1901 including a semiconducting material 2113 and then an electrically insulating material 2114. Moreover, implant regions 2301 and 2302 can be formed adjacent to the bottom surfaces of trenches 1901 and 1903 respectively. The formation of implant regions 2301 and 2302 facilitate the formation of bit line structures for controlling the charge flow through charge storage regions. As described in embodiments herein, an electrically conductive structure 2305 can be formed overlying portions of the workpiece including portions within the trenches 1901 and 1903 as well as portions overlying the trenches 1901 and 1903.

Notably, in accordance with an embodiment, the distance 2307 between the trenches 1901 and 1903 (measured center-to-center as illustrated) can be at least approximately 150 nm. According to another embodiment, the distance 2307 between trench 1901 and 1903 having charge storage structures therein, can be at least approximately 180 nm, such as at least approximately 200 nm, or even at least approximately 220 nm. In accordance with a particular embodiment, the distance 2307 between trenches 1901 and 1903 having charge storage structures therein, is within a range of between approximately 220 nm and approximately 300 nm, and more particularly within a range between 220 nm and approximately 260 nm.

Additionally, while the distance 2307 between trenches 1901 and 1903 facilitates improved electrical insulation between the charge storage structures, the provision of the trench 1702 having the electrically insulating material 2001 disposed therein provides further electrical insulation between charge storage structures within trench 1901 and charge storage structures within trench 1903. In accordance with an embodiment, the distance 2309 between the trench 1901 and trench 1702 (measured center-to-center) is a fraction of the distance 2307 between trenches 1901 and 1903. As such, in a more particular embodiment, the distance 2309 can be at least approximately 30% of the distance 2307 between trenches 1901 and 1903. In still another more particular embodiment, the distance 2309 is within a range between approximately 40% and approximately 60% of the distance 2307 between trenches 1901 and 1903.

Figure 22:
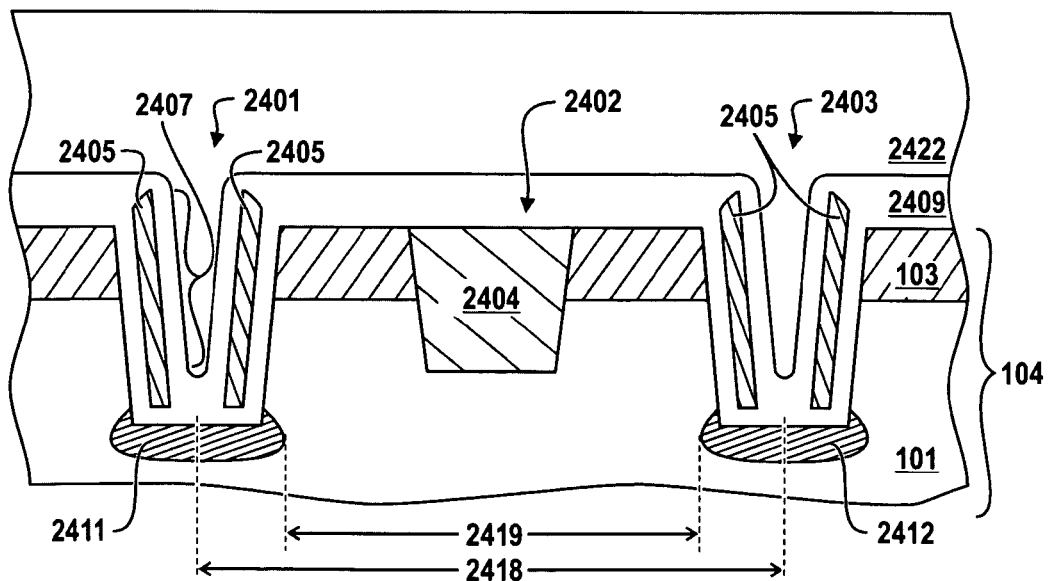
FIG. 22 includes a cross-sectional view of a workpiece including tapered trenches having a charge storage layer therein in accordance with an embodiment.

FIG. 22 includes a cross-sectional illustration of a workpiece including a substrate including trenches formed therein, wherein the trenches include charge storage structures disposed therein, and an electrical insulation trench disposed between the trenches in accordance with an embodiment. Notably, the workpiece of FIG. 22 resembles the workpiece of FIG. 21 including two trenches 2401 and 2403 having charge storage structures therein and separated by a electrically insulating trench 2402 having an electrically insulating material 2404 disposed therein. According to a particular embodiment, the trenches 2401 and 2403 have a tapered cross-sectional contour such that the width of the trenches at the bottom surface is significantly less than the width of the trenches at the surface of the workpiece. Likewise, trench 2402 also includes a tapered cross-sectional contour that is having a width at a bottom surface that is significantly less than the width of the trench 2402 at the surface of the substrate 104. The tapered cross-sectional contour of the trenches 2401-2403 facilitates improved electrical insulation between trenches 2401 and 2403 and lessens the possibility of leakage currents between the trenches through the substrate material.

In accordance with a particular embodiment, the distance 2418 between the center of trench 2401 and the center of trench 2403 may be substantially the same as the distances described in accordance with the embodiment of FIG. 21. The distance 2419 between the adjacent bit line regions 2411 and 2412 of trenches 2401 and 2403 respectively can be significantly greater than in previous embodiments due to the tapered cross-sectional contour. Moreover, in accordance with another embodiment, formation of bit line regions 2411 and 2412 can be facilitated by the formation of trenches 2401 and 2403 having the tapered cross-sectional contours, as the creation of the bit line regions 2411 and 2412 such that portions overlap the vertical side walls of the trenches 2401 and 2403 is made easier based upon the tapered cross-sectional contour of the trenches.

Figure 23:
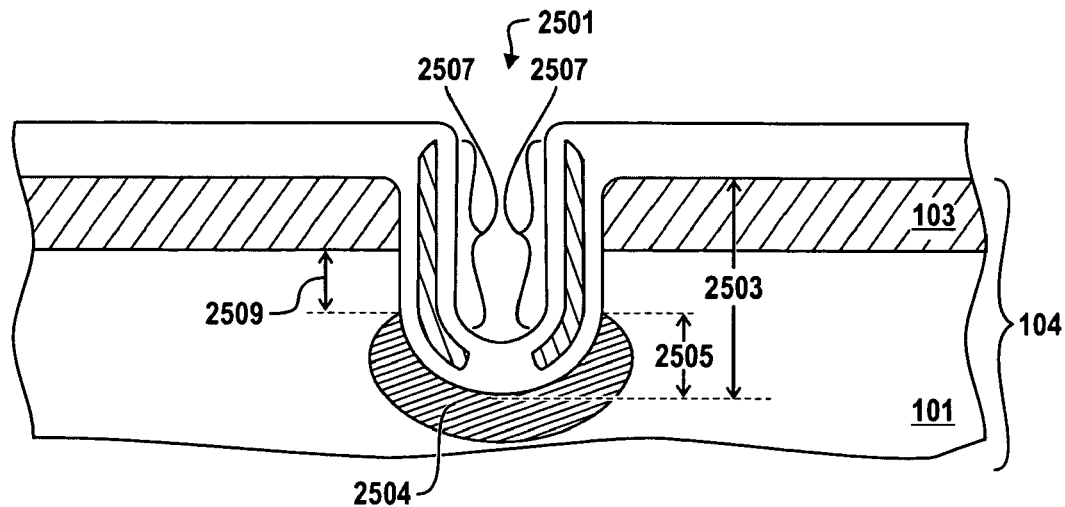
FIG. 23 includes a cross-sectional illustration of a workpiece including a trench having a charge storage layer disposed therein and an implant region overlapping a portion of the vertical side walls of the trench in accordance with an embodiment.

FIG. 23 includes a cross-sectional illustration of a portion of a workpiece including a trench having charge storage structures contained therein in accordance with an embodiment. As illustrated, the workpiece includes a trench 2501 having charge storage structures 2507 and 2509 therein. According to a particular embodiment, the trench 2501 has a depth measured from the top of the substrate 104 to the bottom surface defining the deepest portion of the trench as illustrated by arrow 2503. The depth 2503 of the trench 2501 is the same as those previously described herein. The charge storage structure further includes an implant region 2504 adjacent to the bottom surface of the trench 2501 and wrapping around portions of the vertical side walls of the trench 2501. According to a particular embodiment, the implant region 2504 overlaps the side walls of the trench 2501 for a distance 2505 defined between the bottom surface of the trench 2501 and the uppermost boundary of the implant region along the side wall of the trench 2501. In accordance with a particular embodiment, this overlap distance 2505 is a fraction of the depth 2503 of the trench 2501. In accordance with a particular embodiment, the overlap distance 2505 is not greater than approximately 50% of the depth 2503, such as not greater than approximately 40%, not greater than approximately 30%, or even not greater than approximately 20% of the depth 2503 of the trench 2501. Still, in accordance with another particular embodiment, the overlap distance 2505 is within a range between approximately 5% and approximately 20% of the depth 2503.

In further reference to the overlap distance, generally the overlap distance is not greater than approximately 50 nm. In accordance with a more particular embodiment, the overlap distance 2505 can be less, such as not greater than approximately 40 nm, not greater than approximately 30 nm, or even not greater than approximately 25 nm. Still in one particular embodiment, the overlap distance 2505 is within a range between approximately 5 nm and approximately 25 nm.

In further reference to FIG. 23, a distance 2509 is illustrated which generally illustrates the channel length of the charge storage structure 2507. As illustrated, the channel length 2509 is the measure of the depth 2503 of the trench 2501 minus the depth of the dopant layer 103 within the substrate 104 and minus the overlap distance 2505. Generally, the channel length 2509 is at least about 25% of the depth 2503, such as at least about 30%, or at least about 40%, or even at least about 50% of the depth 2503 of the trench 2501. In accordance with one embodiment, the channel length 2509 is not greater than about 95% of the depth 2503. In a particular embodiment, the channel length 2509 is within a range between about 30% and about 95% of the depth 2503, and more particularly within a range between about 30% and about 80% of the depth 2503 of the trench 2501.

It will be appreciated that while the embodiments of FIGS. 21-23 do not illustrate the localized implant regions illustrated in FIG. 13, such embodiments may incorporate such implant regions.

Figure 25:
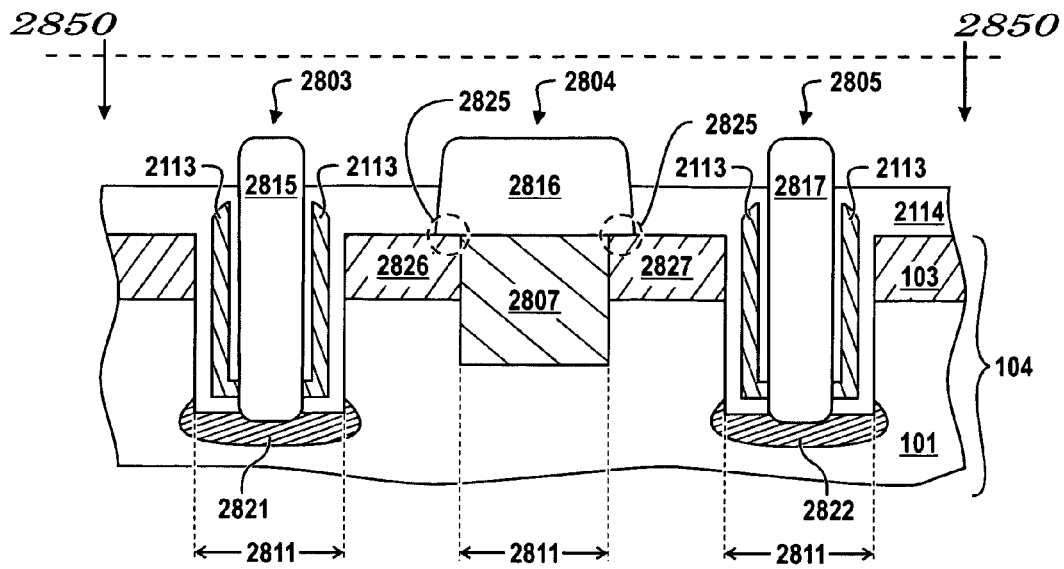
FIG. 25 includes a cross-sectional illustration of a workpiece including trenches, wherein two of the trenches have a conductive structure disposed therein and another trench between the two trenches includes a conductive structure overlying the trench in accordance with one embodiment.

FIG. 25 includes a cross-sectional illustration of a workpiece including a substrate having two trenches formed therein, wherein the two trenches include charge storage structures disposed therein, and a trench disposed between the two trenches in accordance with an embodiment. Notably, the workpiece of FIG. 25 resembles the workpiece of FIG. 21 including two trenches 2803 and 2805 having charge storage structures 2113 therein and separated by a electrically insulating trench 2804 having an electrically insulating material 2807 disposed therein. According to a particular embodiment, the trenches 2803, 2804, and 2805 (2803-2805) have a width 2811 that is greater than the width of the trenches illustrated in FIG. 21. The width 2811 is greater to facilitate the formation of conductive structures and generally has a width 2811 that is at least about 5% greater than the widths 1501-1503 of corresponding trenches 1701-1703 described in accordance with the embodiments of FIG. 15. In accordance with another embodiment, the width 2811 of the trenches 2803-2805 is at least about 10% greater, at least about 15% greater, or even at least about 20% greater than the widths 1501-1503 of corresponding trenches 1701-1703 described in accordance with the embodiments of FIG. 15. Generally, the width 2811 of the trenches 2803-2805 is not greater than about 75% of the widths 1501-1503 of corresponding trenches 1701-1703 described in accordance with FIG. 15.

In more detail, generally, the width 2811 of the trenches 2803-2805 is at least about 80 nm. In another embodiment, the width 2811 is at least about 100 nm, such as at least about 110 nm, or even at least about 120 nm. In accordance with a particular embodiment, the width 2811 of the trenches 2803-2805 is within a range between about 80 nm and about 200 nm, and more particularly within a range between about 90 nm and about 160 nm.

Figure 26:
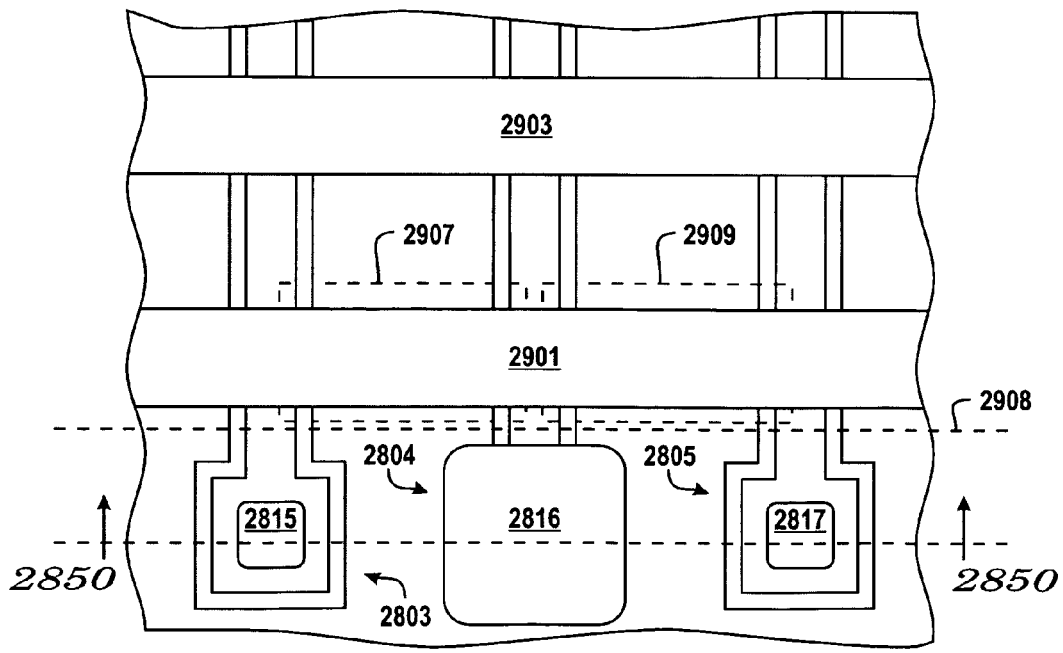
FIG. 26 includes a top view of the workpiece of FIG. 25 including trenches, electrically conductive structures overlying the trenches at a substantially orthogonal angle, and conductive structures within portions of the trenches or overlying the trenches in accordance with an embodiment.

The trenches 2803-2805 that are portions of trenches previously formed as will be more fully illustrated in FIG. 26, can be formed to have greater widths by additional etching within the particular regions of the workpiece. In one embodiment, the process of forming the trenches 2803-2805 can include exposing the portion of the workpiece in the particular region to a longer etching process as compared to the process of forming the trenches 1701-1703 as described herein. In another embodiment, the formation of the trenches 2803-2805 can include an additional etching process that may further include an additional masking process. Otherwise, subsequent processing of the trenches 2803-2805 can be completed substantially as described herein, including the formation of a charge storage structures within the trenches and the implant regions.

In accordance with another embodiment, the trenches 2803 and 2805 include conductive structures 2815 and 2817 disposed within the trenches 2803 and 2805. In a particular embodiment, the conductive structures 2815 and 2817 are disposed within the trenches 2803 and 2805 such that they extend for the full depth of the trenches extending above the top surface of the layer 2114 and extend for the entire depth of the trenches 2803 and 2805 such that they contact the implant regions 2821 and 2822 at the bottom of the trenches 2803 and 2805. In one particular embodiment, the conductive structures 2815 and 2817 are electrical contacts suitable for controlling the charge flow through charge storage regions. Accordingly, the conductive structures 2815 and 2817 can include a metal, polysilicon, or a combination thereof suitable for forming an electrical contact.

Moreover, FIG. 25 further illustrates a conductive structure 2816 disposed over the trench 2804 and the insulating material 2807 within the trench 2804. In a more particular embodiment, the conductive structure 2816 has a width that is significantly greater than the width of the trench 2804 such that overlap regions 2825 are formed and the conductive structure contacts regions 2826 and 2827 on either side of the trench 2804. In accordance with an embodiment, the electrically conductive structure 2816 can be a bit line contact and the overlap regions 2825 facilitate electrical contact between the electrically conductive structure 2816 and the regions 2826 and 2827 of the implant layer 103. Such a design facilitates control of charge flow through charge storage structures contained within the trenches 2803 and 2805.

The formation of such an electrically conductive structure 2816 can include patterning a resist material and selectively removing portions of layer 2114 overlying the trench 2804 containing the electrically insulating material 2807 and subsequently selectively depositing an electrically conductive material on the portion of the workpiece to form the electrically conductive structure 2816. In accordance with one embodiment, the electrically conductive structure 2816 can include a metal, polysilicon, or a combination thereof suitable for forming an electrical contact.

Referring to FIG. 26 a plan view of the workpiece of FIG. 25 is illustrated in accordance with an embodiment. FIG. 26 includes the trenches 2803, 2804, and 2805 (2803-2805) and overlying conductive structures 2901 and 2903 in accordance with an embodiment. As illustrated, the electrically conductive structures 2901 and 2903, which in a particular embodiment are word lines, overlie portions of the trenches 2803-2805, however do not overlie the portions of the trenches 2804-2805 previously illustrated in FIG. 25. The portions of the trenches 2803-2805 along the axis 2850 (as seen in cross-section of FIG. 25) are wider than the portions of the trenches 2803-2805 intersecting the axis 2908, and accordingly the portion of the trenches 2803-2805 along the axis 2850 are suitable for forming the electrically conductive structures 2815-2817. In accordance with a particular embodiment, the electrically conductive structures 2815-2817 facilitate control of the charge flow through the charge storage layers in the charge storage structures 2907 and 2909.

It should be noted that while the conductive structure 2816 is illustrated as overlying a portion of the trench 2804, in accordance with an alternative embodiment, the trench 2804 may not extend as far as the trenches 2803 and 2805 such that the trench 2804 and conductive structure 2816 may not overlap. Such an alternative embodiment is feasible, as the trench 2804 serves to electrically insulate the trenches 2803 and 2805 and more particularly electrically insulate the charge storage structures 2907 and 2909 from each other.

In accordance with the illustrated embodiment, the electrically conductive structures 2901 and 2903 overlie the trenches 2803-2305 at a substantially orthogonal angle, however, as previously described herein, the electrically conductive structures 2901 and 2903 can be angled at a non-orthogonal angle with respect to the trenches 2803-2805 as illustrated in FIG. 24.

Embodiments herein have described various electrical components and methods of forming such components. Table 1 is provided below to further illustrate the variations of processes that may be undertaken in forming the electronic components described in embodiments herein. In particular, Table 1 illustrates a number of different processing procedures, each having a different order of steps to complete formation of an electronic component as disclosed herein.

TABLE 1

| | Process | | | | | |
|---|---|---|---|---|---|---|
| | First Process | Second Process | Third Process | Fourth Process | Fifth Process | Sixth Process |
| Form Trenches | 1 | 1 | 1 | 1 | 1 | 1 |
| Form Spacers | | | 2 | 5 | 4 | 4 |
| Remove Spacers | | | 4 | 7 | 7 | 7 |
| Form a first layer of charge storage layer | 3 | 2 | 5 | 2 | 2 | 2 |
| Form a second layer of the charge storage layer | 4 | 3 | 6 | 3 | 3 | 3 |
| Etch a portion of the second layer | | | | | 6 | 6 |
| Form a third layer of the charge storage layer | 5 | 4 | 7 | 4 | 8 | 10 |
| Form first localized implant regions | | | | | | 8 |
| Form second localized implant regions | | | | | | 9 |
| Form bit line implant regions | 2 | 5 | 3 | 6 | 5 | 5 |
| Annealing | 6 | 6 | 8 | 8 | 9 | 11 |

As noted in Table 1, some of the processes may not be completed to form the electronic components described herein. In accordance with one embodiment, the formation of spacers within the trenches may not be undertaken in some processes. In other embodiments, the formation of first and second localized implant regions may not always be completed. According to another embodiment, the formation of the charge storage layer including the first layer, second layer, and third layer may all be undertaken in directly proceeding processes (as illustrated in the First, Second, Third, and Fourth Processes) or alternatively, the formation of one or more of the layers may be separated by other processes, such as implanting and etching. It will be appreciated that the processes of Table 1 are illustrative of the different order that certain processes disclosed herein may be completed. Table 1 is not intended to be a comprehensive diagram of each of the variations, and changes to the order of processes are possible.

According to the processes provided herein, charge storage structures are provided having certain designs and features demonstrating a distinct difference from the state of the art. The combination of features provided herein including for example the bit line implants having an overlap distance, the use of trenches having different depths, the orientation of word lines with respect to the charge storage structures, and the utilization of localized charge storage regions to control the channel length results in charge storage structures having certain features which in combination improve electronic device performance while reducing the space necessary to generate such charge storage units. Such structures can be formed by the combination of certain processes disclosed herein, including for example creation of localized implantation regions, use of particular layers, use of particular materials, annealing processes, etching processes and deposition or growth processes that facilitate the formation of charge storage structures having improved performance as well as decreased and compact size.

In summary, according to one aspect, a method of forming an electronic device is disclosed that includes forming a first trench in a workpiece including a substrate, the first trench having side walls and a bottom surface extending for a width between the side walls. The method of the first aspect further includes forming a charge-storage layer along the side walls and bottom surface of the first trench, implanting ions within the substrate underlying the bottom surface of the first trench to form an implant region, and annealing the implant region, wherein after annealing, the implant region extends the width of the bottom surface and along a portion of the side walls. According to an embodiment of the first aspect, the method further includes forming spacers along the side walls of the first trench prior to implanting, and then implanting ions with the spacers along the side walls of the first trench.

According to another embodiment of the first aspect, implanting ions further includes implanting a n-type dopant. In another embodiment, the method further includes implanting ions through the side walls of the trench and into the substrate to form localized implant regions before implanting ions within the substrate to form an implant region, such that the localized implant regions comprise a different dopant material than the implant region. According to a particular embodiment of the first aspect, annealing includes heating the workpiece at an annealing temperature of not less than approximately 800° C. In a more particular embodiment of the first aspect, annealing includes heating the workpiece at the annealing temperature for a time period of not less than approximately 30 seconds.

In still another embodiment of the first aspect, the method further includes forming a second trench within the workpiece adjacent to the first trench, the second trench including side walls and a bottom surface extending for a width between the side walls. In a particular embodiment, the method further includes forming a third trench between the first trench and the second trench, the third trench having a depth significantly different than a depth of the first trench and a depth of the second trench. In a still more particular embodiment, the first trench and the second trench have substantially the same depth and the third trench has a depth that is at least approximately 10% less than the depth of the first trench and the second trench. In another more particular embodiment of the first aspect, the method further includes an electrically conductive structure having a first portion within a portion of the third trench and a second portion of the electrically conductive structure overlying a portion of the third trench, wherein the electrically conductive structure has a width that is significantly greater than a width of the third trench. Still, in another more particular embodiment, an insulating material substantially fills the third trench.

According to another embodiment of the first aspect, the method further includes forming a first electrically conductive structure having a first portion overlying a portion of the first trench and a second portion of the electrically conductive structure within a portion of the first trench, wherein the first electrically conductive structure is formed at a substantially non-orthogonal angle to a length of the first trench. Moreover, in such an embodiment, the method further includes forming a second electrically conductive structure having a first portion overlying a portion of the second trench and a second portion within a portion of the second trench, wherein the second electrically conductive structure is formed at a substantially non-orthogonal angle to a length of the second trench. In accordance with a particular embodiment, the non-orthogonal angle is an acute angle.

In accordance with an embodiment of the first aspect, the method further includes depositing an insulating material within a portion of the first trench adjacent to the bottom surface after forming the implant region. In a more particular embodiment, the method further includes depositing a semiconductive material within a portion of the first trench overlying the insulating material after forming the implant region.

Still, in accordance with an embodiment of the first aspect the method for forming the first trench includes forming a photoresist layer overlying the workpiece including the substrate, patterning the photoresist layer to have openings, and selectively removing portions of the workpiece underlying the openings. While in another embodiment of the first aspect, the method of forming the charge-storage layer further includes removing a portion of a nitrogen-containing layer overlying the bottom surface and exposing a first oxygen-containing layer on the bottom surface. In a more particular embodiment, forming the charge storage layer further includes forming spacers along the side walls overlying the nitrogen-containing layer prior to removing a portion of the nitrogen-containing layer, etching a portion of the nitrogen-containing layer overlying the bottom surface and exposing the first oxygen-containing layer on the bottom surface, then removing the spacers, and forming a second oxygen-containing layer along the side walls overlying the nitrogen-containing layer and along the bottom surface overlying the first oxygen-containing layer.

According to another aspect, a method of forming an electronic device includes forming a first trench in a workpiece having side walls and a bottom surface extending for a width between the side walls, forming a second trench in the workpiece having side walls and a bottom surface extending for a width between the side walls, and forming a third trench in the workpiece having side walls and a bottom surface extending for a width between the side walls, wherein the third trench has a depth that is significantly less than a depth of the first trench and a depth of the second trench. According to the second aspect, the method further includes depositing an electrically insulating material within the third trench, and forming a charge-storage layer within the first trench and the second trench.

In accordance with an embodiment of the second aspect, the method further includes implanting ions within the substrate underlying the bottom surface of the first trench to form a first implant region containing the implanted ions, and implanting ions within the substrate underlying the bottom surface of the second trench to form a second implant region containing the implanted ions. The embodiment further includes annealing the workpiece to form a third region containing the implanted ions, wherein the third region extends along a portion of the side walls of the first trench, and annealing the workpiece to form a fourth region containing the implanted ions, wherein the fourth region extends along a portion of the side walls of the second trench.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of forming an electronic device comprising:
    forming a first trench in a workpiece including a substrate, the first trench having side walls and a bottom surface extending for a width between the side walls;
    forming a charge-storage layer along the side walls and bottom surface of the first trench;
    forming spacers along the side walls of the first trench overlying the charge-storage layer;
    subsequent to forming the spacers, implanting ions within the substrate underlying the bottom surface of the first trench to form an implant region;
    etching, after forming the spacers, at least a portion of the charge-storage layer;
    removing the spacers after etching; and
    annealing the implant region, wherein after annealing, the implant region extends the width of the bottom surface and along a portion of the side walls.

2. The method of claim 1, wherein implanting ions comprises implanting a n-type dopant.

3. The method of claim 1, wherein annealing comprises heating the workpiece at an annealing temperature of not less than approximately 800° C.

4. The method of claim 3, wherein annealing comprises heating the workpiece at the annealing temperature for a time period of at least approximately 30 seconds.

5. The method of claim 1, further comprising forming a second trench within the workpiece adjacent to the first trench, the second trench including side walls and a bottom surface extending for a width between the side walls.

6. The method of claim 1, further comprising:
    depositing an insulating material within a portion of the first trench adjacent to the bottom surface after forming the implant region.

7. The method of claim 6, further comprising:
    depositing a semiconductive material within a portion of the first trench overlying the insulating material after forming the implant region.

8. The method of claim 1, wherein forming the first trench comprises:
    forming a photoresist layer overlying the workpiece including the substrate;
    patterning the photoresist layer to have openings; and
    selectively removing portions of the workpiece underlying the openings.

9. The method of claim 1, wherein forming the charge-storage layer further comprises:
    forming a first oxygen-containing layer;
    forming a nitrogen-containing layer over the first oxygen-containing layer; and
    removing a portion of the nitrogen-containing layer overlying the bottom surface and exposing the first oxygen-containing layer on the bottom surface.

10. The method of claim 9, wherein forming the charge storage layer further comprises:
    the etching, wherein a portion of the nitrogen-containing layer overlying the bottom surface is etched, and exposing the first oxygen-containing layer on the bottom surface; and
    forming a second oxygen-containing layer along the side walls overlying the nitrogen-containing layer and along the bottom surface overlying the first oxygen-containing layer.

11. The method of claim 1, further comprising implanting ions within the substrate adjacent to the side walls of the trench to form localized implant regions before implanting ions within the substrate to form an implant region, wherein the localized implant regions comprise a different dopant material than the implant region.

12. The method of claim 5, further comprising forming a third trench between the first trench and the second trench, the third trench having a depth significantly different than a depth of the first trench and a depth of the second trench.

13. The method of claim 12, wherein the first trench and the second trench have substantially the same depth and the third trench has a depth that is at least approximately 10% less than the depth of the first trench and the second trench.

14. The method of claim 12, further comprising:
    forming an electrically conductive structure having a first portion within a portion of the third trench and a second portion overlying a portion of the third trench, wherein the electrically conductive structure has a width that is significantly greater than a width of the third trench.

15. The method of claim 12, further comprising forming an electrically insulating material within the third trench.

16. The method of claim 7, further comprising:
    forming a first electrically conductive structure having a first portion overlying a portion of the first trench and a second portion of the electrically conductive structure within a portion of the first trench, wherein the first electrically conductive structure is formed at a substantially non-orthogonal angle to a length of the first trench; and
    forming a second electrically conductive structure having a first portion overlying a portion of the second trench and a second portion within a portion of the second trench, wherein the second electrically conductive structure is formed at a substantially non-orthogonal angle to a length of the second trench.

17. The method of claim 16, wherein the non-orthogonal angle is an acute angle.

18. The method of claim 1 further comprising:
    forming a first trench in a workpiece having side walls and a bottom surface extending for a width between the side walls
    forming a second trench in the workpiece having side walls and a bottom surface extending for a width between the side walls; and
    forming a third trench in the workpiece having side walls and a bottom surface extending for a width between the side walls, wherein the third trench has a depth that is significantly less than a depth of the first trench and a depth of the second trench.

19. The method of claim 18 further comprising:
    depositing an electrically insulating material within the third trench;

forming a charge-storage layer within the second trench;
forming spacers along the side walls of second trench overlying the charge-storage layer;
subsequent to forming the spacers of the second trench, implanting ions within the substrate underlying the bottom surface of the second trench to form implant regions; and etching, after forming the spacers, at least a portion of the charge-storage layer; and removing the spacers after etching.

* * * * *

UNITED STATES PATENT AND TRADEMARK OFFICE
CERTIFICATE OF CORRECTION

PATENT NO. : 8,409,952 B2
APPLICATION NO. : 12/102488
DATED : April 2, 2013
INVENTOR(S) : Parikh et al.

It is certified that error appears in the above-identified patent and that said Letters Patent is hereby corrected as shown below:

Claims:
Claim 16, column 22, line 34, "claim 7" should read --claim 5--.

Signed and Sealed this
Ninth Day of July, 2013

Teresa Stanek Rea
*Acting Director of the United States Patent and Trademark Office*